United States Patent
Shimoida et al.

(10) Patent No.: US 6,683,777 B2
(45) Date of Patent: Jan. 27, 2004

(54) SEMICONDUCTOR PROTECTIVE CONTROL UNIT FOR CONTROLLING OUTPUT TRANSISTORS CONNECTED TO INDUCTIVE LOAD

(75) Inventors: Yoshio Shimoida, Yokosuka (JP); Kraisorn Throngnumchai, Yokohama (JP); Toshiro Karaki, Yokosuka (JP)

(73) Assignee: Nissan Motor Co., Ltd., Yokohama (JP)

(*) Notice: Subject to any disclaimer, the term of this patent is extended or adjusted under 35 U.S.C. 154(b) by 412 days.

(21) Appl. No.: 09/745,734

(22) Filed: Dec. 26, 2000

(65) Prior Publication Data

US 2001/0005028 A1 Jun. 28, 2001

(30) Foreign Application Priority Data

Dec. 28, 1999 (JP) .......................... P11-373484
Dec. 28, 1999 (JP) .......................... P11-373486
Jan. 31, 2000 (JP) .......................... P2000-022032

(51) Int. Cl.[7] .............................................. H01H 47/32
(52) U.S. Cl. ........................................ 361/152; 361/87
(58) Field of Search ........................ 361/87, 88, 91, 361/93, 56, 30, 18, 31, 152; 357/300, 351, 379, 386, 387; 318/293

(56) References Cited

U.S. PATENT DOCUMENTS 5,119,000 A * 6/1992 Schultz ................ 318/254
5,936,439 A * 8/1999 Pollersbeck ............ 327/110
5,946,178 A * 8/1999 Bijlenga ............... 361/91.5

FOREIGN PATENT DOCUMENTS

JP         6-252408      9/1994
JP         8-84060       3/1996

* cited by examiner

Primary Examiner—Gregory J. Toatley, Jr.
Assistant Examiner—Boris Benenson
(74) Attorney, Agent, or Firm—Foley & Lardner

(57) ABSTRACT

A protective control unit for controlling a highside-output transistor and a lowside-output transistor connected in series is provided. The highside-output transistor has a first main electrode region connected to a power supply, a second main electrode region and a first control electrode. The lowside-output transistor has a third main electrode region connected to the second main electrode region, a fourth electrode region connected to ground and a second control electrode. And an inductive load is connected to a connecting point between the second and the third electrode regions. The protective control unit of the present invention has a highside-drive circuit. The highside-drive circuit pulls out charges stored in the highside-output transistor, through the first control electrode, during the periods when the highside-output transistor is in the end of reverse conducting state and reverse recovery state. The charges are pulled out by short-circuiting between the first control electrode and the second main electrode region during the periods when the highside-output transistor is in the end of reverse conducting state and reverse recovery state. Or, the charges are pulled out by a providing a potential having an opposite polarity to the charges during the periods when the highside-output transistor is in the end of reverse conducting state and reverse recovery state.

25 Claims, 19 Drawing Sheets

SEMICONDUCTOR PROTECTIVE CONTROL UNIT FOR CONTROLLING OUTPUT TRANSISTORS CONNECTED TO INDUCTIVE LOAD

This application claims benefit of priority under 35 USC 119 based on Japanese Patent Application No. P11-373484 and No. P11-373486 both filed Dec. 28, 1999, and Japanese Patent Application No. P2000-22032 filed Jan. 31, 2000, the entire contents of which are incorporated by reference herein.

BACKGROUND OF THE INVENTION

1. Field of the Invention

This invention pertains to a protective control unit for controlling output stage power semiconductor elements, the power semiconductor elements supplying current for an inductive load.

2. Description of the Related Art

As the control unit for controlling the power semiconductor elements at the output stages, which drives current into the inductive load, chopper circuits or H bridge circuits, which for example, control motions of the induction motors, etc. are known. In these circuits, protection circuits for protecting the output stage power semiconductor elements from a counter electromotive force (emf) generated in the inductive load is employed. For example, an H bridge circuit having the protection circuit is disclosed in Japanese Published Unexamined Patent Application 8-84060. The H bridge circuit has a highside-output transistor, which forms a highside-arm, and a lowside-output transistor, which forms a lowside-arm. The highside and lowside-output transistors are connected in series, and the inductive load such as motor, etc. is connected to the connecting point between highside and lowside-output transistors. A highside-driver is connected to base terminal of the highside-output transistor, and a lowside-driver is connected to base terminal of the lowside-output transistor. A voltage power supply Vcc is connected to collector terminal of the highside-output transistor, and emitter terminal of the lowside-output transistor is grounded. Between emitter-base terminals of the highside-output transistor, a highside-freewheeling diode is connected. Similarly, between the emitter-base terminals of the lowside-output transistor, a lowside-freewheeling diode is connected.

The breakdowns or destructions of the highside and lowside output transistors are prevented by passing currents due to the counter emf generated in the inductive load through these highside and lowside-freewheeling diodes. For example, the lowside-output transistor pass the current along the direction in which the current from the inductive load flows through the lowside-output transistor, when it is turned on by the lowside-driver. Afterwards, when the counter emf is generated in the inductive load, as the lowside-driver turns off the lowside-output transistor, the potential of the connecting point between the highside and lowside-output transistors rises. Then, the highside-freewheeling diode is forward biased, because the potential of the connecting point rises above the potential of the base terminal of the highside-output transistor, and the current flows in the highside-freewheeling diode. Thereafter, the highside-output transistor turns on in reverse-directional, and the return current due to the counter emf flows from the inductive load to the highside-output transistor.

However, the highside-output transistor becomes in a reverse recovery operation, while the highside-output transistor is turned on in the reverse-direction, when the lowside-output transistor turns on again. Then, the current flows from the inductive load along the direction to the lowside-output transistor again. Therefore, the charges stored in the highside-output transistor remain as they are. As this result, it is made to be a condition in which unrequired current flows in the forward direction of the highside-output transistor, i.e. from the collector to the emitter direction, though the highside-output transistor is supposed to be the off state. Namely, there is a problem that a large "through-current" penetrating from the highside to lowside-output transistor flows in the conventional control unit for driving the power semiconductor elements having inductive load.

SUMMARY OF THE INVENTION

The purpose of the present invention is to provide a protective control unit for safely controlling the power semiconductor elements, serving as the output transistors, sufficiently pulling out the charges, which would be stored in the output transistors.

Another object of the present invention is to provide the protective control unit having lower power dissipation, and the miniaturization of the device size is easy.

Still another object of the present invention is to provide the protective control unit, in which the destruction or the breakdown of the output transistors due to the through-current penetrating from the highside to lowside output transistors is effectively prevented.

Still another object of the present invention is to provide the protective control unit, in which the turn-off time of the output transistors are shortened.

In view of above objects, a first feature of the present invention pertains to a protective control unit for controlling a highside-output transistor and a lowside-output transistor connected in series. The highside-output transistor has a first main electrode region connected to a power supply, a second main electrode region and a first control electrode. The lowside-output transistor has a third main electrode region connected to the second main electrode region, a fourth electrode region connected to ground and a second control electrode. And an inductive load is connected to a connecting point between the second and the third electrode regions. Namely, the protective control unit according to the first feature of the present invention inheres in a highside-drive circuit. The highside-drive circuit pulls out charges stored in the highside-output transistor, through the first control electrode, during the periods when the highside-output transistor is in the end of reverse conducting state and reverse recovery state.

A second feature of the present invention pertains to a protective control unit for controlling the highside-output transistor and the lowside-output transistor connected in series. That is, the second feature of the present invention lies in a charge removing means for pulling out charges stored in the highside-output transistor, through the first control electrode, during the periods when the highside-output transistor is in the end of reverse conducting state and reverse recovery state.

DETAILED DESCRIPTION OF THE PREFERRED EMBODIMENT

Figure 1:
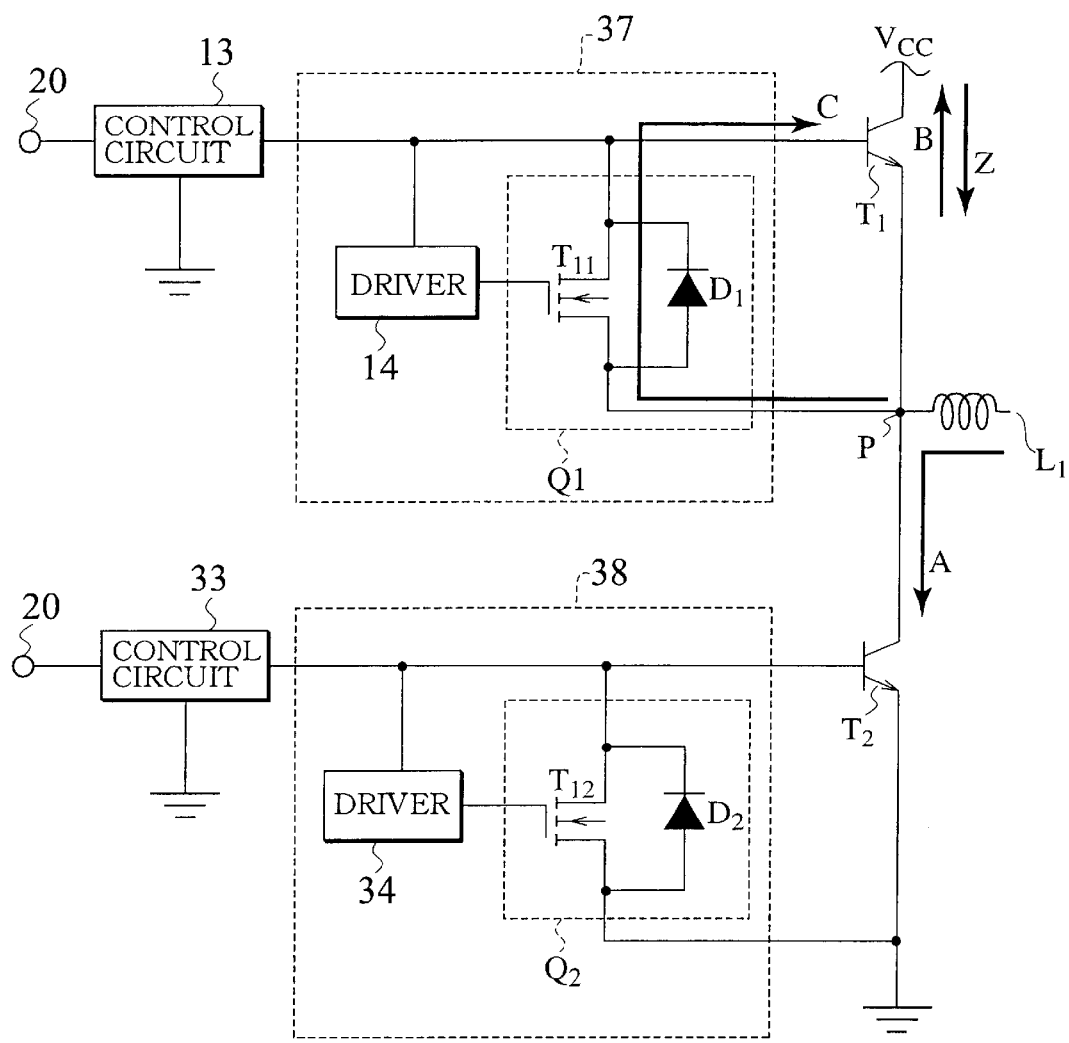
FIG. 1 is a circuit configuration of a protective control unit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

(First Embodiment)

FIG. 1 shows a part of a H bridge circuit, which controls motions of an induction motor, as an example of the protective control unit, according to the first embodiment of the present invention. In FIG. 1, a highside-output transistor T1 and a lowside-output transistor T2 are semiconductor switching devices, which supply driving currents to an inductive load L1 of motors, etc. The highside-output transistor T1 has base, emitter and collector regions, corresponding to "a first control electrode region", "a first main electrode region" and "a second main electrode region" respectively, which are made of semiconductor regions in general. The base, emitter and collector regions have their own base, emitter and collector electrodes, which serve as base, emitter and collector terminals, respectively. The base, emitter and collector electrodes are made of metallic layers in general, and may be called a first control electrode, first and second main electrodes respectively. And the lowside-output transistor T2 has base, emitter and collector regions, similarly, corresponding to "a second control electrode regions", "a third main electrode region" and "a forth main electrode region", respectively. The base, emitter and collector regions of the lowside-output transistor T2 have their own base, emitter and collector electrodes, which serve as base, emitter and collector terminals, which may be called a second control electrode, third and fourth main electrodes respectively.

The base terminals of the highside-output transistor T1 is connected to a highside-drive circuit 37, and the base terminals of the lowside-output transistor T2 is connected to a lowside-drive circuit 38. The highside-drive circuit 37 pulls out charges stored in the highside-output transistor T1, through the first control electrode of the highside-output transistor T1, during the periods when the highside-output transistor is in the end of reverse conducting state and reverse recovery state. Similarly, the lowside-drive circuit 38 pulls out charges stored in the lowside-output transistor T2 through the second control electrode of the lowside-output transistor T2, during the periods when the lowside-output transistor is in the end of reverse conducting state and reverse recovery state. The highside-drive circuit 37 has a highside-switching element Q1 and a highside-driver 14. The highside-switching element Q1 is connected between the first control electrode and the second main electrode. The highside-driver 14 provides drive signals to the highside switching element Q1 so that the highside switching element Q1 conducts during the periods when the highside-output transistor T1 is in the end of reverse conducting state and reverse recovery state. The highside-drive circuit 37 serves as claimed charge removing means in the present invention, which pulls out charges stored in the highside-output transistor T1, through the first control electrode, during the periods when the highside-output transistor is in the end of reverse conducting state and reverse recovery state.

Similarly, the lowside-drive circuit 38 has a lowside-switching element Q2 and a lowside-driver 34. The lowside-switching element Q2 is connected between the second control electrode and the fourth main electrode. The lowside-driver 34 provides drive signals to the lowside switching element Q2 so that the lowside switching element Q2 conducts during the periods when the lowside-output transistor T2 is in the end of reverse conducting state and reverse recovery state. The lowside-drive circuit 38 serves as another charge removing means in the present invention, which pulls out charges stored in the lowside-output transistor T2, through the second control electrode, during the periods when the lowside-output transistor is in the end of reverse conducting state and reverse recovery state.

The highside-drive circuit 37 and the lowside-drive circuit 38 are connected to a highside-control circuit 13 and a lowside-control circuit 33, respectively. Then, the base terminals of the highside-output transistor T1 and the lowside-output transistor T2 are also connected to the highside-control circuit 13 and the lowside-control circuit 33, respectively. Therefore, the highside-control circuit 13 and the lowside-control circuit 33 drive the highside-output transistor T1 and the lowside-output transistor T2, respectively.

A voltage power supply Vcc is connected to the collector terminal of the highside-output transistor T1, and the emitter terminal of the lowside-output transistor T2 is grounded. The inductive load L1 is connected to a node "P", which is a connecting point between the emitter terminal of the highside-output transistor T1 and the collector terminal of the lowside-output transistor T2. Between the emitter-base terminals of the highside-output transistor T1, an nMOS-switching element Q1 is connected. The nMOS-switching element Q1 is constructed with an nMOS transistor T11 and a parasitic body diode D1. The parasitic body diode D1 is structurally integrated with the nMOS transistor T11, which serves as a main device. The integral body diode D1 is connected in parallel between drain-source terminals of the nMOS transistor T11. The nMOS transistor T11, which is the main device of the nMOS switching element Q1, is turned on and off by a highside-driver 14, which is connected to gate terminal of the nMOS transistor T11. Still, an nMOS switching element Q2 is also similarly connected between the emitter-base terminals of the lowside-output transistor T2. The nMOS switch element Q2 is constructed with an nMOS transistor T12, which is the main device, and a parasitic diode D2 structurally merged with the nMOS switching element Q2. A lowside-driver 34, connected to the gate terminal of the nMOS transistor T12, turns on and off the nMOS transistor T12, which is the main device of the nMOS switching element Q2.

Figure 2:
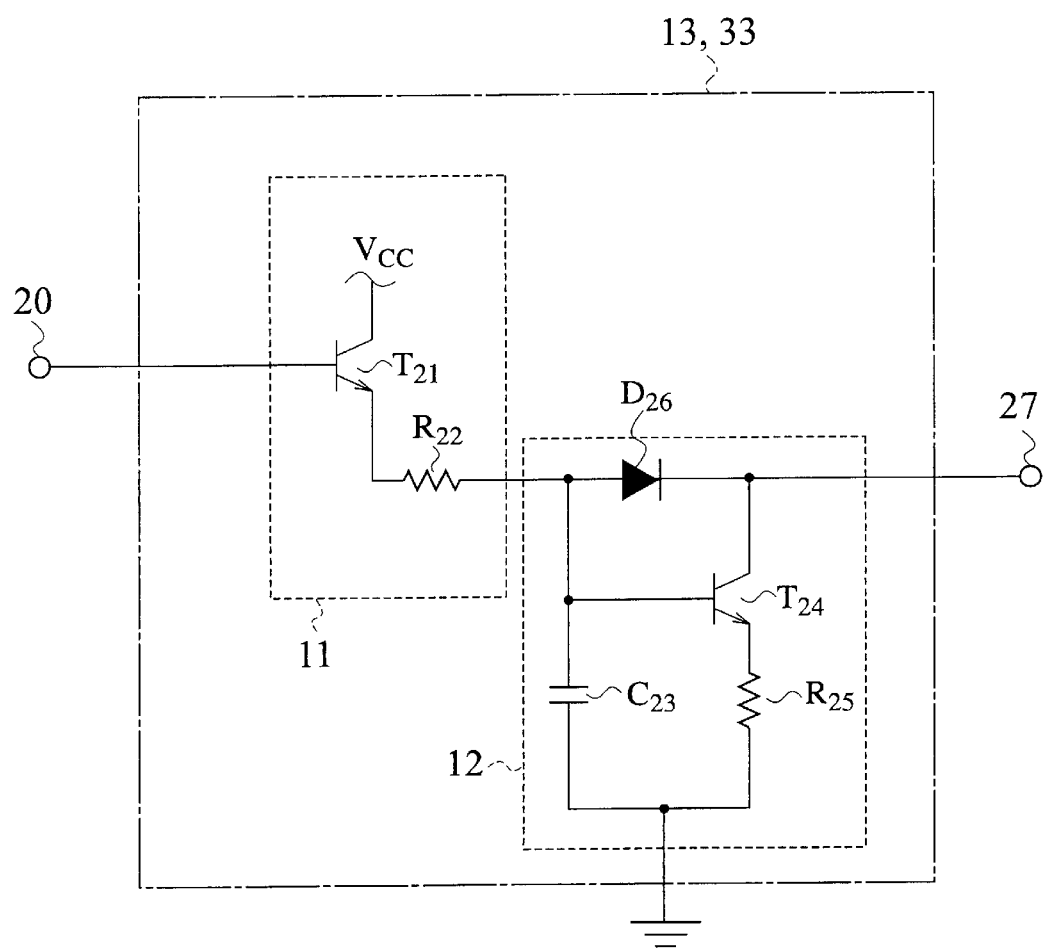
FIG. 2 is a circuit configuration, which explains the details of a highside-control circuit and a lowside-control circuit in the protective control unit according to the first embodiment of the present invention.

FIG. 2 shows an example of the circuit configuration, which explains the details of the highside-control circuit 13 or the lowside-control circuit 33. As shown in FIG. 2, each of the highside-control circuit 13 and the lowside-control circuit 33 includes an impedance adjustment circuit 12 and a switching circuit 11. The impedance adjustment circuit 12 has an npn bipolar transistor T24, a capacitor C23, a resistor R25 and a diode D26. The switching circuit 11 has an npn bipolar transistor T21 and a resistor R22. The switching circuits 11 in the highside-control circuit 13 outputs the driving current which drives the highside-output transistor T1 through an output terminal 27 of the highside-control circuit 13, according to the level of the voltage signal which is supplied to an input terminal 20 of the highside-control circuit 13. Similarly, the switching circuits 11 of the lowside-control circuit 33 outputs the driving current which drives the lowside-output transistor T2 via output terminal 27 of the lowside-control circuit 33, according to the level of voltage signal which is supplied to the input terminal 20 of the lowside-control circuit 33. The impedance adjustment circuit 12 of the highside-control circuit 13 changes an output impedance of the highside-control circuit 13, which is the impedance between the output terminal 27 and the ground, based on the level of voltage signal fed at the input terminal 20. Similarly, the impedance adjustment circuit 12 of the lowside-control circuit 33 changes the impedance between the output terminal 27 and the ground, based on the level of the voltage signal, which is supplied to the input terminal 20 of the lowside-control circuit 33.

(Operation of Highside-Control Circuit)

The operation of the highside-control circuit 13 is explained with reference to FIG. 1.

(a) By turning on the npn bipolar transistor T21, according to the input voltage signal of high level, supplied to the input terminal 20 of the highside-control circuit 13, the driving current flows through resistor R22 and diode D26 into the base terminal of the highside-output transistor T1. The base terminal of the highside-output transistor T1 is supplied with this driving current through the output terminal 27, and the driving current (base current) drives the highside-output transistor T1.

(b) Then, the npn bipolar transistor T24 turns on, according to the charging up level of the capacitor C23 of the impedance adjustment circuit 12, with a predetermined charging-up time. That is to say, the impedance between the base terminal of the highside-output transistor T1 and the ground becomes low, i.e., the impedance between the output terminal 27 and the ground decreases, when the npn bipolar transistor T24 turns on.

(c) Next, the driving current does not flow into the base terminal of the highside-output transistor T1, through the output terminal 27, as the npn bipolar transistor T21 turning off, when the input voltage signal of low level is fed to the input terminal 20 of the highside-control circuit 13.

(d) However, this time, the on state of the npn bipolar transistor T24 is maintained for a specific interval after the npn bipolar transistor T21 has turned off. This is because, through the npn bipolar transistor T24 and resistor R25, the charges stored in the capacitor C23 discharges in the specific interval after the npn bipolar transistor T21 has turned off. That is to say, the low impedance condition is maintained between the base-ground terminals of the highside-output transistor T1 in the specific interval, after the highside-output transistor T1 is turned off. Then, using this specific interval, it becomes possible that the charges stored in the highside-output transistor T1 is quickly pulled out through the base region. As this result, the turn-off time of the highside-output transistor T1 is shortened.

(e) And then, as the current does not flow into the base terminal of the npn bipolar transistor T24, when the discharge of charges stored in the capacitor C23 finishes, the npn bipolar transistor T24 is turned off. By this, the impedance between the base-ground terminals of the highside-output transistor T1 rises.

(Operation of Lowside-Control Circuit)

The lowside-control circuit 33 also similarly operates as the highside-control circuit 13. That is to say, the driving current which drives the lowside-output transistor T2 is supplied through the output terminal 27 by responding to the voltage signal supplied to the input terminal 20 of the lowside-control circuit 33. And the impedance between the base-ground terminals of the lowside-output transistor T2 changes according to the voltage signal supplied to the input terminal 20 of the lowside-control circuit 33.

(Highside/Lowside-Drivers)

A highside-driver 14 is connected to the highside-control circuit 13, and a lowside-driver 34 is connected to the lowside-control circuit 33. For example, the highside-driver 14 and the lowside-driver 34 invert the output signals of the highside-control circuit 13 and the lowside-control circuit 33, respectively, and they provide the drive signals for the nMOS switching elements Q1 and Q2, respectively. The inverters may execute the inversions.

The highside-driver 14 or the lowside-driver 34 output the drive signal of low level, when the driving current for the highside-output transistor T1 or the lowside-output transistor T2, from the output terminal 27 of the highside-control circuit 13 or the lowside-control circuit 33, is supposed to be output. And, the drive signals of the high level is output, when the driving current for the highside-output transistor T1 or the lowside-output transistor T2, from the output terminal 27 of the highside-control circuit 13 or the lowside-control circuit 33 is not required to be output. As this result, the nMOS switching element Q1 is so controlled such that it is turned off, when the highside-output transistor T1 turns on, and it is turned on, when the highside-output transistor T1 turns off. And, similarly, the nMOS switching element Q2 is turned off, when the lowside-output transistor T2 turns on, and it is turned on, when the lowside-output transistor T2 turns off.

The operations of the protective control unit are explained as follows:

(Operation of Highside-Arm Circuit)

Figure 3:
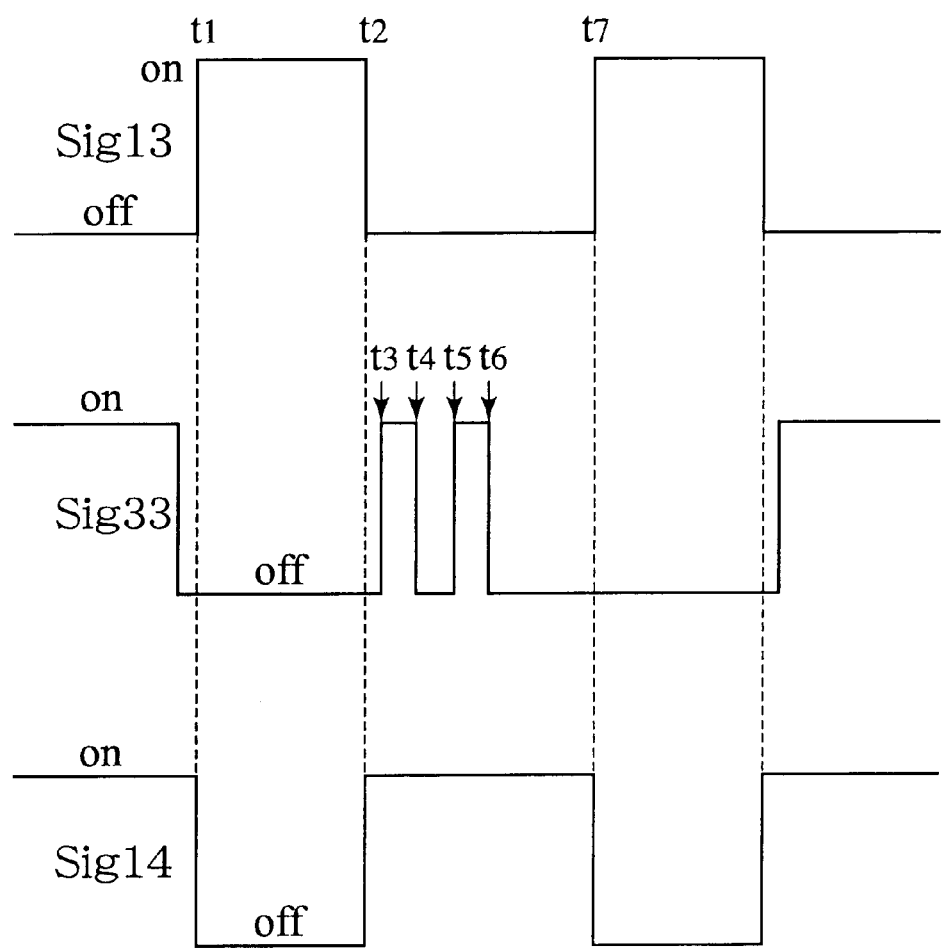
FIG. 3 is a time chart showing the mutual relation of the signals so as to explain the operation of the highside-arm circuit of the circuit configuration shown in FIG. 1.

FIG. 3 is a time chart showing the output signal (Sig13) supplied from the output terminal 27 of the highside-control circuit 13, the output signal (Sig14) for driving the nMOS switching element Q1 supplied from the highside-driver 14 and the output signal (Sig33) supplied from the output terminal 27 of the lowside-control circuit 33.

(a) At a timing t1 of FIG. 3, if the output signal (Sig13) from the highside-control circuit 13 becomes high level, the terminals between the base-emitter electrodes of the highside-output transistor T1 is biased in a forward direction. Then, the driving current flows in the base terminal and the highside-output transistor T1 is turned on in the forward direction. As this result, the current flows in the direction shown by an arrow "Z" in FIG. 1. This time, by the action of the impedance adjustment circuit 12 in the highside-control circuit 13, the output impedance of the highside-control circuit 13 lowers, and the impedance between the base-ground terminals of the highside-output transistor T1 lowers.

(b) At a timing t2 of FIG. 3, if the output signal (Sig13) from the highside-control circuit 13 becomes low level, which is lower than the built-in potential between base-emitter pn-junction, the driving current cease to flow into the base terminal and the highside-output transistor T1 starts the turn-off transition. The low impedance condition is maintained, by the action of the impedance adjustment circuit 12 in the highside-control circuit 13, between the base-ground terminals of the highside-output transistor T1 in the specific interval, after the highside-output transistor T1 starting the turn-off transition. In this specific interval, through the base terminal of the highside-output transistor T1, the charges stored in the highside-output transistor T1 are pulled out to the ground. The impedance between the base-ground terminals of the highside-output transistor T1 rises, when the discharge of the stored charges in the capacitor C23 (See FIG. 2) of the impedance adjustment circuit 12 ends.

(c) At a timing t3 in FIG. 3, when the lowside-output transistor T2 turns on from the off state, by the output signal (Sig33) supplied from the lowside-control circuit 33, under the turn-off transition of the highside-output transistor T1 by pulling out the charges stored in the highside-output transistor T1, the current now flows in the direction shown by the arrow "A" shown in FIG. 1.

(d) Afterwards, the counter emf is generated in the inductive load L1 at the timing t4 in FIG. 3, when the lowside-output transistor T2 is turned off by the output signal (Sig33) supplied from the lowside-control circuit 33. The potential at node "P" shown in FIG. 1 rises by this counter emf. The current passes from the source to drain terminal of the nMOS switching element Q1, because nMOS switching element Q1 is kept in the on state by the action of the highside-driver 14, when the potential at the node "P" rises above the potential of the base terminal of the highside-output transistor T1, i.e. the current flows in the direction by the arrow "C" shown in FIG. 1. This time, the highside-output transistor T1 turns on in the reverse-direction as a result of the high impedance between the base-ground terminals of the highside-output transistor T1. The current flows in the direction shown by the arrow "B" in FIG. 1, which is the reverse-direction of the highside-output transistor T1. That is, the reverse-directional current flows from the emitter to collector terminal of the highside-output transistor T1. The power dissipation is smaller than the case in which it flows in the body diode (the integral parasitic element) D1, because the nMOS transistor (main device) T11 in the on state has lower impedance than the body diode D1.

(e) Next, the highside-output transistor T1 shifts to the "reverse recovery operation" at the timing t5 in FIG. 3, under the condition that the return currents in the directions shown by the arrows "B" and "C" are still flowing, and when the lowside-output transistor T2 turns on by the lowside-control circuit 33 again. Although the impedance between the base-ground terminals of the highside-output transistor T1 is high, the charges in the collector region of the highside-output transistor T1 are removed, because the nMOS switching element Q1 is now turned on. That is to say, the charges in the collector region of the highside-output transistor T1 are pulled out, through the nMOS switching element Q1, from the base to emitter terminal of the highside-output transistor T1. As this result, the highside-output transistor T1 remains in the off state, and the large through-current penetrating from the collector to emitter terminal of the highside-output transistor T1 does not flow.

(f) Afterwards, similarly to the timing t4, by turning on the highside-output transistor T1 in the reverse-direction, as shown at the timing t6 in FIG. 3, when the lowside-control circuit 33 turns the lowside-output transistor T2 to on state again, the return current flows from the emitter to collector terminal.

(g) Next, the highside-control circuit 13 provides the output signal (Sig13) of the high level again so that the driving current flows into the base terminal of the highside-output transistor T1, as shown by the timing t7 in FIG. 3. As this result, the operations equal to the timing t1 are repeated, turning the highside-output transistor T1 on in the forward direction.

(Operation of Lowside-Arm Circuit)

Figure 4:
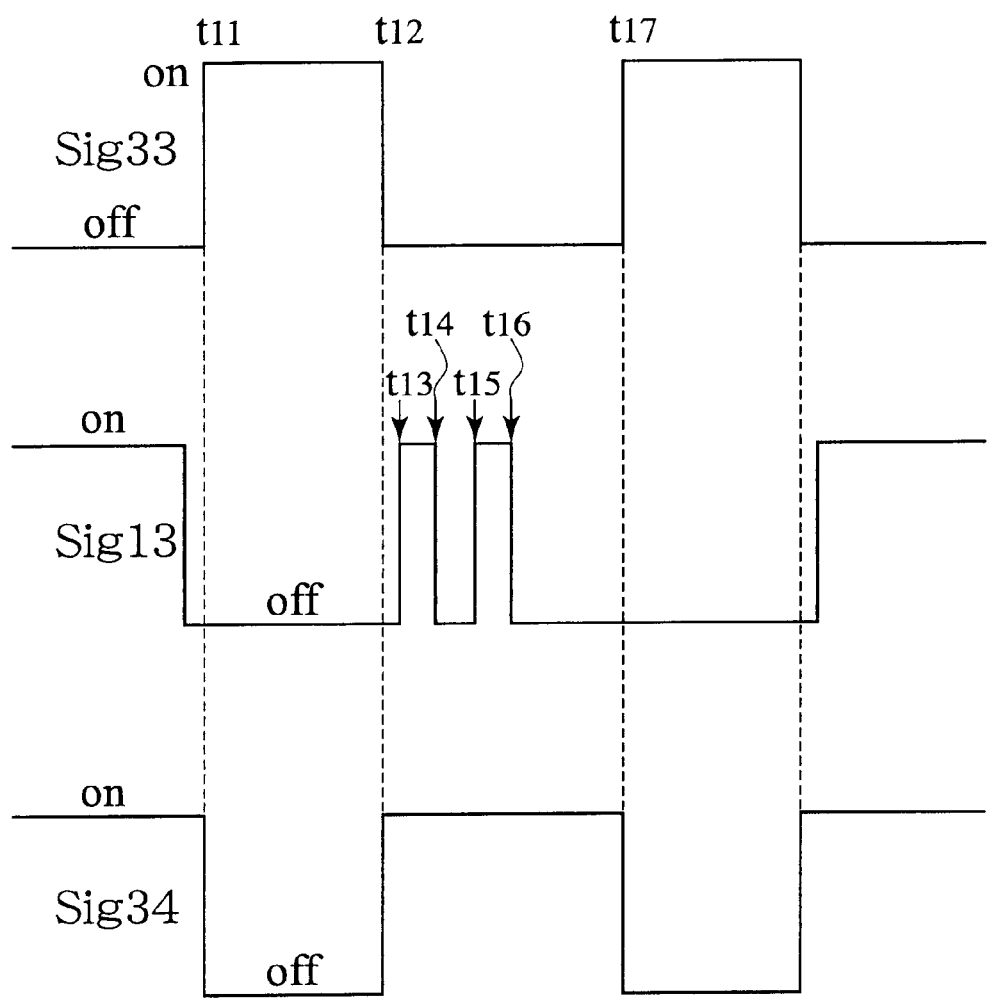
FIG. 4 is a time chart showing the mutual relation of the signals so as to explain the operation of the lowside-arm circuit in the circuit configuration shown in FIG. 1.

FIG. 4 is a time chart showing the output signal (Sig13) supplied from the output terminal 27 of the highside-control circuit 13, the output signal (Sig34) for driving the nMOS switching element Q2 supplied from the lowside-driver 34 and the output signal (Sig33) supplied from the output terminal 27 of the lowside-control circuit 33.

(a) At the timing t11 shown in FIG. 4, when the output signal (Sig33) of the high level is supplied from the lowside-control circuit 33, the driving current flows into the base terminal of the lowside-output transistor T2 so as to turn on in the forward direction. Therefore, the current flows in the direction shown by the arrow "G" in FIG. 5. This time, the impedance between the base-ground terminals of the lowside-output transistor T2 lowers by the action of the impedance adjustment circuit 12 in the lowside-control circuit 33.

(b) At the timing t12 shown in FIG. 4, when the output signal (Sig33) of low level is supplied from the lowside-control circuit 33, the driving current does not flow into the base terminal of the lowside-output transistor T2, and the lowside-output transistor T2 starts the turn-off transition. The low impedance condition is maintained, by the action of the impedance adjustment circuit 12 in the lowside-control circuit 33, between the base-ground terminals of the lowside-output transistor T2 in the specific interval, after the lowside-output transistor T2 starting the turn-off transition. In this specific interval, through the base terminal of the lowside-output transistor T2, the charges stored in the lowside-output transistor T2 are pulled out to the ground. The impedance between the base-ground terminals of the lowside-output transistor T2 rises, when the discharge of the stored charges in the capacitor C23 (See FIG. 2) of the impedance adjustment circuit 12 ends.

Figure 5:
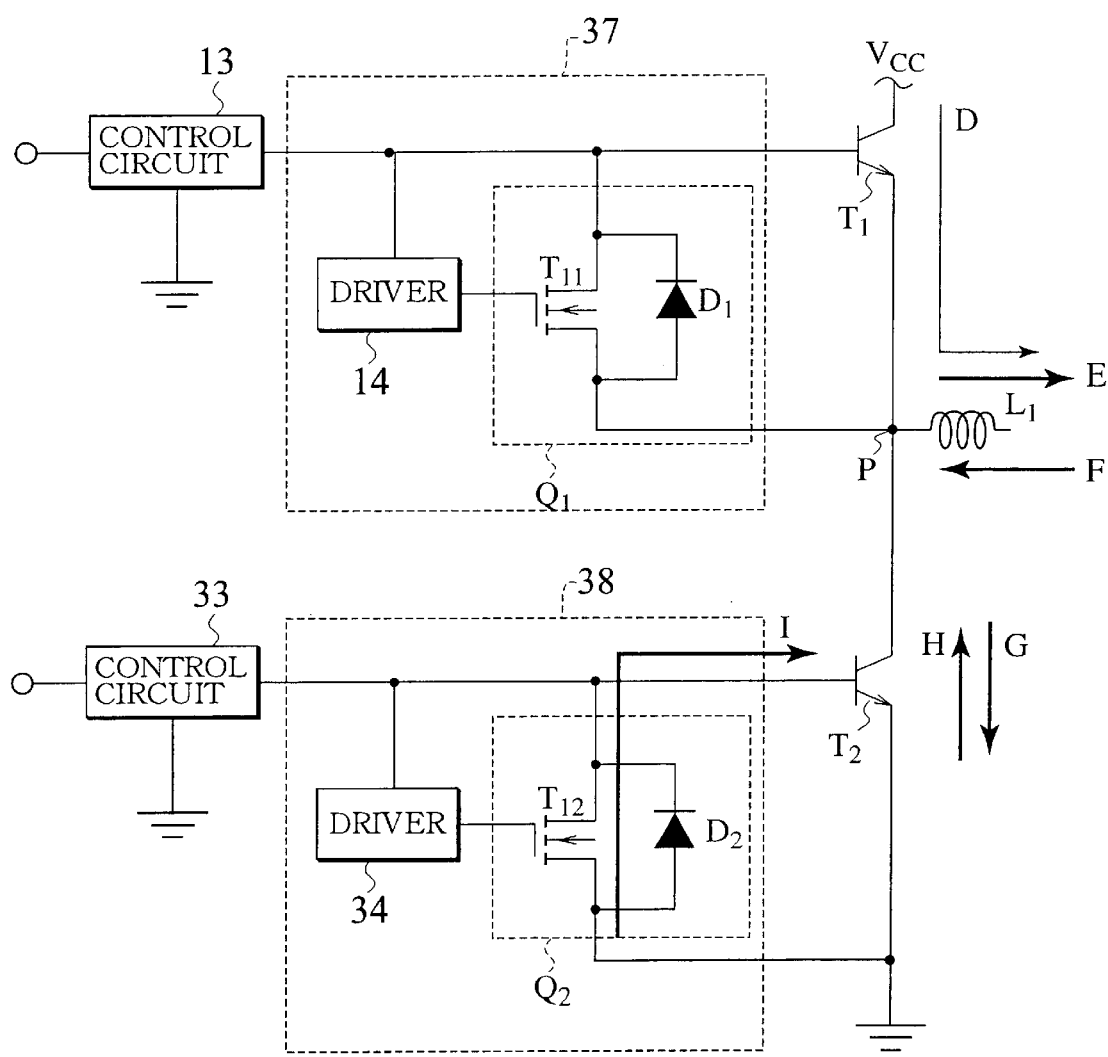
FIG. 5 is a circuit configuration, which shows the current directions according to the time chart shown in FIG. 4.

(c) At the timing t13 as shown in FIG. 4, when the highside-control circuit 13 drives the highside-output transistor T1 to turn on from the off state, the current flows in the direction by the arrow "D" in FIG. 5, while the lowside-output transistor T2 is still continuing the turn-off transition, by pulling out the charges stored in the lowside-output transistor T2.

(d) Afterwards, at the timing t14 as shown in FIG. 4, the counter emf is generated in the inductive load L1, when the highside-output transistor T1 is turned off by the highside-control circuit 13, and the potential at node "P" shown in FIG. 5 falls by this counter emf. The potential of the base terminal of the lowside-output transistor T2 lowers to a value, which is below the potential at the emitter terminal, when the potential at node "P" lowers below the ground. The current passes from the source to drain terminal of the nMOS switching element Q2, because the nMOS switching element Q2 is turned on by the action of the lowside-driver 34 in the direction by the arrow "I" in FIG. 5. At this time, the current also flows in the direction shown by the arrow "H" in FIG. 5. Namely, the lowside-output transistor T2 turns on in the reverse-direction, because the impedance between the base-ground terminals of the lowside-output transistor T2 is maintained at the high state, flowing the current from the emitter to collector terminal. The power dissipation is smaller than the case in which it flows in the integral body diode D2, because the on state impedance of the nMOS transistor T12 is lower than that of body diode D2.

(e) The lowside-output transistor T2 turns into the reverse recovery operation, under the condition that the return currents are still flowing along the directions shown by the arrows "I" and "H" in FIG. 5, at the timing t15 as shown in FIG. 4, when the highside-control circuit 13 turns the highside-output transistor T1 on again. Though the impedance between the base-ground terminals of the lowside-output transistor T2 is still high, the charges stored in the lowside-output transistor T2 is removed, because the nMOS switching element Q2 is turned on. That is to say, the charges stored in the lowside-output transistor T2 are transferred through the nMOS switching element Q2, from the base to emitter terminal of the lowside-output transistor T2. As this result, the lowside-output transistor T2 becomes off state, and the large through-current penetrating from the collector to emitter terminal of the lowside-output transistor T2 does not flow.

(f) Afterwards, similarly to the timing t14, as shown at the timing t16 in FIG. 4, when the highside-control circuit 13 turns the highside-output transistor T1 off again, the lowside-output transistor T2 turns on in the reverse direction. That is, the return current flows from the emitter to collector terminal of the lowside-output transistor T2.

(g) Next, at the timing t17 in FIG. 4, the lowside-control circuit 33 provides the output signal (Sig33) of high level so that the driving current can flow into base terminal of the lowside-output transistor T2. As this result, the operations equal to the timing t11 are repeated, turning the lowside-output transistor T2 on in the forward direction.

(1) According to the first embodiment of the present invention, the power dissipation becomes low in comparison with the case in which the return current is flowing through the conventional freewheeling diode, since through on state nMOS switching elements Q1 and Q2 having lower on-state resistances $r_{DS(on)}$, the current required for turning on the highside-output transistor T1 or the lowside-output transistor T2, can flow in the reverse direction. As this result, it becomes possible that the semiconductor device is miniaturized.

(2) In addition to the technical advantage of (1), the charges stored the highside-output transistor T1 or the lowside-output transistor T2 are effectively pulled out through the on state nMOS switching element Q1 or Q2 having the lower on-state resistance $r_{DS(on)}$, when the highside-output transistor T1 or the lowside-output transistor T2 becomes in the reverse recovery operation. It is possible to pull out the stored carriers from the collector regions into emitter terminal of the highside-output transistor T1 or the lowside-output transistor T2 with smaller power dissipation. Because there are no charges stored in the transistor, and either the highside-output transistor T1 or the lowside-output transistor T2 is safely kept in the off state, the flow of the through-current is effectively prevented. Then the destruction or the breakdown of the opposing output transistor, which is not operating in the reverse recovery state, by the through-current is effectively prevented.

(3) The technical advantages of (1) and (2) are obtained for either case in which current flows in the inductive load L1 along the direction shown by the arrow "E" or "F" in FIG. 5. This is because the topologies of the highside and lowside-arm circuits are made to be symmetrical.

(4) By the impedance adjustment circuit 12, the low impedance condition, in which the impedance between the base-ground terminals of the highside-output transistor T1 or the lowside-output transistor T2 is guaranteed. And the on state of the npn bipolar transistor T24 is maintained for the specific interval, after the npn bipolar transistor T21 has turned off. As this result, the turn-off time of the highside-output transistor T1 and the lowside-output transistor T2 is shortened, because the charges stored in the highside-output transistor T1 and the lowside-output transistor T2 can be pulled out through base regions quickly.

In the circuit configurations shown in FIG. 1 and FIG. 5, the circuit elements, which can withstand higher voltages, are used in the highside-arm circuit, in comparison with the circuit elements constituting lowside-arm circuit. That is to say, the circuit elements which withstand at least the voltage $V_{highside}$ are used in the highside-control circuit 13, the highside-driver 14, the nMOS switching element Q1, constituting the highside-arm circuit, where the voltage $V_{highside}$ is given by following Eq. (1).

$$V_{highside} = Vcc + Vb \quad (1)$$

In Eq. (1), Vcc is a voltage across the highside-output transistor T1 and the lowside-output transistor T2, supplied by the voltage power supply Vcc, and Vb is a relatively low voltage required for operations of these circuitry. In the meantime, the lowside-control circuit 33, the lowside-driver 34 and the nMOS switching element Q2, constituting lowside-arm circuit, may use the circuit elements, which withstand the voltage $V_{lowside}$ with the reference to the ground, where the voltage $V_{lowside}$ is given by following Eq. (2).

$$V_{lowside} = Vb \quad (2)$$

In the description of the first embodiment, the nMOS switching elements Q1 and Q2 are respectively connected between the emitter and base terminals of the highside-output transistor T1 and the lowside-output transistor T2, respectively. However, it is also possible to employ a circuit topology, in which only one of the highside-output transistor T1 or the lowside-output transistor T2 has the nMOS switching element Q1 or Q2, between the emitter and base terminals of the output transistor T1 or T2, and the nMOS switching element turns off/on according to the off/on operation of the corresponding output transistor T1 or T2. In this case, the destruction or the breakdown of the other output transistor by the through-current is prevented, because the through-current does not flow in the output transistors to which the nMOS switching element is connected.

(Second Embodiment)

Figure 6:
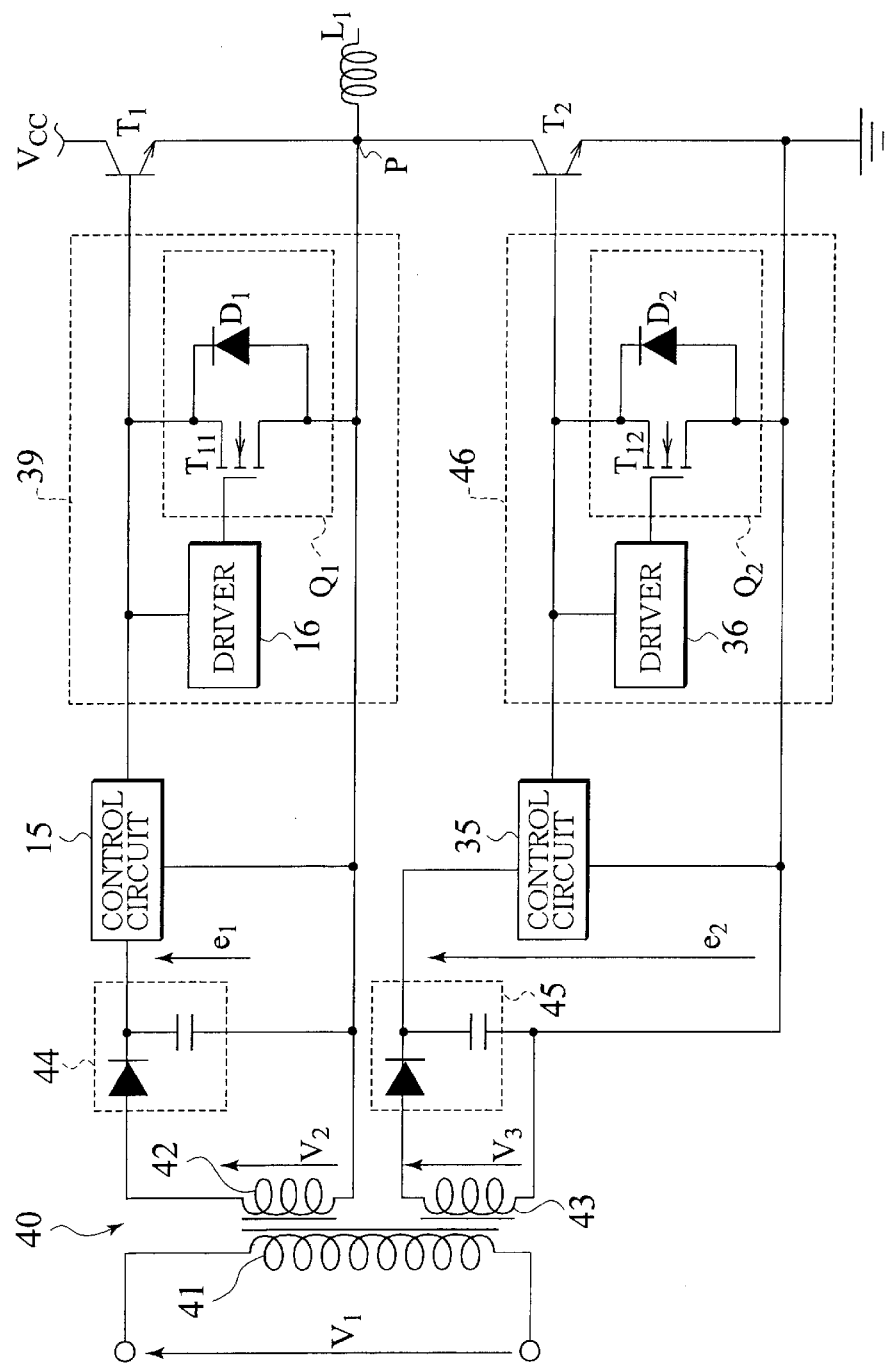
FIG. 6 is a circuit configuration of a protective control unit according to a second embodiment of the present invention.

FIG. 6 is a circuit configuration of the protective control unit according to the second embodiment of the present invention. In the second embodiment, the required supply voltages are provided by a transformer 40 for respective drivers, which is a different feature from the first embodiment.

The base terminals of the highside-output transistor T1 is connected to a highside-drive circuit 39, and the base terminals of the lowside-output transistor T2 is connected to a lowside-drive circuit 46. The highside-drive circuit 39 pulls out charges stored in the first main electrode region, through the first control electrode of the highside-output transistor T1, during the periods when the highside-output transistor is in the end of reverse conducting state and reverse recovery state. Similarly, the lowside-drive circuit 46 pulls out charges stored in the lowside-output transistor T2 through the second control electrode of the lowside-output transistor T2, during the periods when the lowside-output transistor is in the end of reverse conducting state and reverse recovery state. The highside-drive circuit 39 has a highside-switching element Q1 and a highside-driver 16. As the highside-switching element Q1, the nMOS-switching element Q1 is connected between emitter-base terminals of the highside-output transistor T1, or connected between the first control electrode and the second main electrode of the highside-output transistor T1. The highside-driver 16 provides drive signals to the highside switching element Q1 so that the highside switching element Q1 conducts during the periods when the highside-output transistor T1 is in the end of reverse conducting state and reverse recovery state. The highside-drive circuit 38 serves as claimed charge removing means in the present invention, which pulls out charges stored in the highside-output transistor T1, through the first control electrode, during the periods when the highside-output transistor is in the end of reverse conducting state and reverse recovery state.

Similarly, the lowside-drive circuit 46 has a lowside-switching element Q2 and a lowside-driver 36. As the lowside-switching element Q2, the nMOS switching element Q2 is connected between emitter-base terminals of the lowside-output transistor T2. That is, the lowside-switching element Q2 is connected between the second control electrode and the fourth main electrode of the lowside-output transistor T2. The lowside-driver 36 provides drive signals to the lowside switching element Q2 so that the lowside switching element Q2 conducts during the periods when the lowside-output transistor T2 is in the end of reverse conducting state and reverse recovery state. The highside-drive circuit 39 and the lowside-drive circuit 46 are connected to a highside-control circuit 15 and a lowside-control circuit 35, respectively. Then, the base terminals of the highside-output transistor T1 and the lowside-output transistor T2 are also connected to the highside-control circuit 15 and the lowside-control circuit 35, respectively. Therefore, the highside-control circuit 15 and the lowside-control circuit 35 drive the highside-output transistor T1 and the lowside-output transistor T2, respectively.

Though the circuit configuration of the highside-control circuit 15, the highside-driver 16, the lowside-control circuit 35, the lowside-driver 36 are same as the corresponding highside-control circuit 13, the highside-driver 16, the lowside-control circuit 33 and the lowside-driver 36, explained in the first embodiment, the supply voltages applied to these circuitry are different.

In FIG. 6, the power supply circuit has the transformer 40 and the smoothing circuits 44 and 45. A voltage V1 supplied between the terminals of a primary coil 41 of the transformer 40 is transformed into a voltage V2 between terminals of the secondary coil 42 and a voltage V3 between terminals of the secondary coil 43 of the transformer 40. Between the terminals of the secondary coil 42 a smoothing circuit 44 is connected. And between the terminals of the secondary coil 43, a smoothing circuit 45 is connected. The smoothing circuit 44 smoothes the voltage V2 across the terminals of the secondary coil 42, and voltage e1 across the output terminals of the smoothing circuit 44 is applied in the highside-control circuit 15. The smoothing circuit 45 smoothes the voltage V3 across the terminals of the secondary coil 43, and voltage e2 across the output terminals of smoothing circuit of 45 is applied in the highside-control circuit 15. The reference potential for the voltage V2 across the terminals of the secondary coil 42 and that for the voltage e1 across the output terminals of the smoothing circuit 44 is the potential at the emitter terminal of the highside-output transistor T1, or the potential at the node "P" shown in FIG. 6. In short, the lower potential side of the terminals of the secondary coil 42, the smoothing circuit 44 and the highside-control circuit 15 is respectively connected to the emitter terminal of the highside-output transistor T1. In the meantime, the reference potential for the voltage V3 across the terminals of the secondary coil 43 and that for the voltage e2 across the output terminals of smoothing circuit of 45 is the ground potential. In short, the lower potential side of the terminals of the secondary coil 43, the smoothing circuit 45 and the lowside-control circuit 35 is respectively grounded.

Similar to the phenomena explained in the first embodiment, owing to the counter emf generated in the inductive load L1, as the highside-output transistor T1 and the lowside-output transistor T2 are operated, the potential at the node "P" shown in FIG. 6, namely the potential of emitter terminal of the highside-output transistor T1 or the collector terminal of the lowside-output transistor T2, fluctuates. However, the value of voltage e1 across the output terminals of the smoothing circuit 44 having the reference potential at the node "P" is kept to a fixed value. Therefore, it does not need to use circuit elements having higher breakdown voltages like the first embodiment for the highside-control circuit 15 and the highside-driver 16. And the circuit design of the highside-control circuit 15 and the highside-driver 16, which are operating with the supply voltages provided by the smoothing circuit 44, becomes easy.

In the second embodiment of the present invention, by using the transformer 40, the supply voltages are applied to the highside-control circuit 15 and the highside-driver 16 configured such that the highside-control circuit 15 and the highside-driver 16 can operate with the "floating state". Therefore, the circuit designs of the highside-control circuit 15 and the highside-driver 16 become easy, and the technical advantage reducing the development cost of the protective control unit, is obtained. And, it becomes possible to miniaturize the device size. Further, the assembling processes of circuit elements are simplified, since smaller circuit elements, having lower breakdown voltage, can be used in the assembly of the highside-control circuit 15 and the highside-driver 16.

(Third Embodiment)

Figure 7:
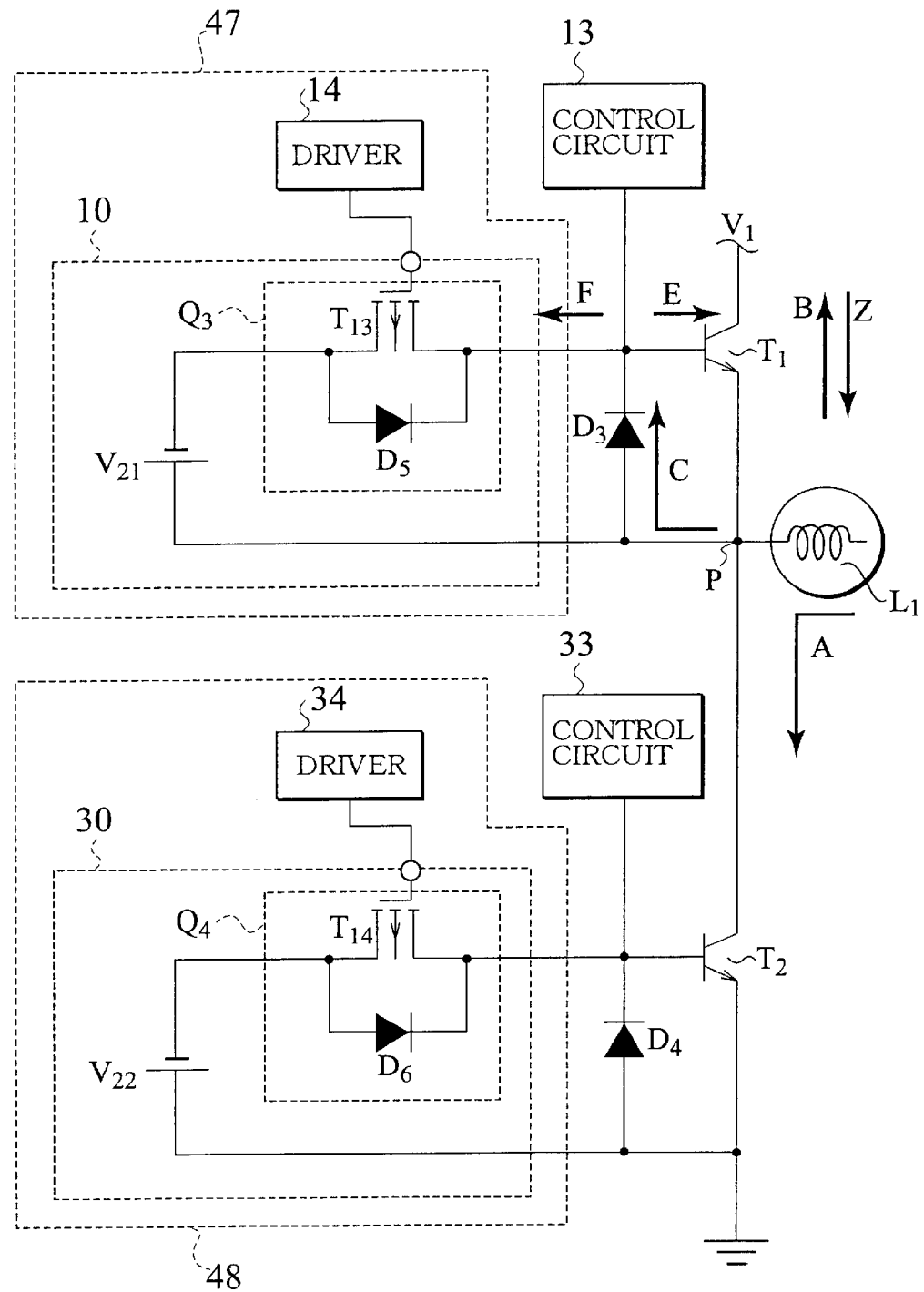
FIG. 7 is a circuit configuration of a protective control unit according to a third embodiment of the present invention.

The protective control unit according to the third embodiment of the present invention drives the highside-output transistor T1 and the lowside-output transistor T2, which are connected in series, as shown in FIG. 7. The voltage power supply V1 is connected to the collector terminal of the highside-output transistor T1, and the emitter terminal of the lowside-output transistor T2 is grounded. In addition, the third embodiment of the present pertains to the H bridge circuit in which the inductive load L1 such as motors is connected to the node "P" between the highside-output transistor T1 and the lowside-output transistor T2. That is to say, the inductive load L1 is connected between the emitter terminal of the highside-output transistor T1 and the collector terminal of the lowside-output transistor T2.

The base terminals of the highside-output transistor T1 is connected to a highside-drive circuit 47, and the base terminals of the lowside-output transistor T2 is connected to a lowside-drive circuit 48. The highside-drive circuit 47 pulls out charges stored in the highside-output transistor T1, through the first control electrode of the highside-output transistor T1, during the periods when the highside-output transistor is in the end of reverse conducting state and reverse recovery state. Similarly, the lowside-drive circuit 48 pulls out charges stored in the lowside-output transistor T2 through the second control electrode of the lowside-output transistor T2, during the periods when the lowside-output transistor is in the end of reverse conducting state and reverse recovery state. The highside-drive circuit 47 has a constant voltage power supply V21, a highside-switching element Q3 and a highside-driver 14. As the highside-switching element Q3, the pMOS-switching element Q3 is connected between the constant voltage power supply V21 and the base terminals of the highside-output transistor T1, or connected between the constant voltage power supply V21 and the first control electrode of the highside-output transistor T1. The highside-driver 14 provides drive signals to the highside switching element Q3 so that a potential of the constant voltage power supply V21 is provided to the first control electrode of the highside-output transistor T1 through the highside switching element Q3, during the periods when the highside-output transistor T1 is in the end of reverse conducting state and reverse recovery state. The highside-drive circuit 47 serves as claimed charge removing means in the present invention, which pulls out charges stored in the highside-output transistor T1, through the first control electrode, during the periods when the highside-output transistor is in the end of reverse conducting state and reverse recovery state.

Similarly, the lowside-drive circuit 48 has a constant voltage power supply V22, a lowside-switching element Q4 and a lowside-driver 34. As the lowside-switching element Q4, the pMOS switching element Q4 is connected between the constant voltage power supply V22 and base terminals of the lowside-output transistor T2. That is, the lowside-switching element Q4 is connected between the constant voltage power supply V22 and the second control electrode of the lowside-output transistor T2. The lowside-driver 34 provides drive signals to the lowside switching element Q4 so that a potential of the constant voltage power supply V22 is provided to the second control electrode of the lowside-output transistor T2 through the lowside switching element Q4, during the periods when the lowside-output transistor T2 is in the end of reverse conducting state and reverse recovery state. The highside-drive circuit 47 and the lowside-drive circuit 48 are connected to a highside-control circuit 13 and a lowside-control circuit 33, respectively. Then, the base terminals of the highside-output transistor T1 and the lowside-output transistor T2 are also connected to the highside-control circuit 13 and the lowside-control circuit 33, respectively. Therefore, the highside-control circuit 13 and the lowside-control circuit 33 drive the highside-output transistor T1 and the lowside-output transistor T2, respectively.

Between the emitter-base terminals of the highside-output transistor T1, a bypass diode D3 is connected. The bypass diode D3 serves as a freewheeling diode, and has anode and cathode electrodes. The anode of the bypass diode D3 is connected to the emitter terminal of the highside-output transistor T1, and cathode of the bypass diode D3 is connected to the base terminal of the highside-output transistor T1. A negative voltage supply circuit 10 having the negative voltage power supply (the constant voltage power supply) V21 and a pMOS switching element Q3 is connected between the emitter-base terminals of the highside-output transistor T1. The negative voltage power supply V21 and the pMOS switching element Q3 are connected in series. The negative voltage power supply V21 generates a negative voltage in respect of the reference voltage, which is defined as the potential at the emitter terminal of the highside-output transistor T1, such that it operates in the floating state to the ground potential. That is to say, the pMOS switching element Q3 has a parasitic body diode D5 structurally merged with a pMOS transistor T13, which serves as a main device of the pMOS switching element Q3. The parasitic body diode D5 is connected between the source and drain terminals of the pMOS transistor T13. The highside-driver 14 is connected to the gate terminal of the pMOS transistor T13 as the main device of the pMOS switching element Q3. The pMOS transistor T13 is controlled by the highside-driver 14 such that it turns on and off according to the signals provided by the highside-driver 14.

Still, a bypass diode D4 is connected between the emitter-base terminals of the lowside-output transistor T2. The bypass diode D4 serves as the freewheeling diode similar to the bypass diode D3, and has anode and cathode electrodes.

And, a negative voltage supply circuit 30, having a negative voltage power supply (the constant voltage power supply) V22 and a pMOS switching element Q4, is connected between the cathode and anode electrodes of the bypass diode D4 in series is connected. The negative voltage power supply V22 and the pMOS switching element Q4 are connected in series. The negative voltage power supply V22 generates a negative voltage in respect of the reference potential, which is the ground potential, or the potential at the emitter terminal the lowside-output transistor T2. The pMOS switching element Q4 has a parasitic body diode D6 and a pMOS transistor T14 serving as a main device of the pMOS switching element Q4. The parasitic body diode D6 is structurally merged with the pMOS transistor T14. A lowside-driver 34 is connected to the gate electrode of the pMOS transistor T14. The pMOS switching element Q4 is controlled by the lowside-driver 34 such that it can turn on and off.

The descriptions of the highside-control circuit 13 and the lowside-control circuit 33 are omitted, because these circuit configurations are identical with those shown in FIG. 2, which are already explained in the first embodiment.

The highside-driver 14 provides drive signals for the pMOS switching element Q3, adjusting the timing of the drive signals. For example, the timing of the drive signal is synchronized with the timing when the lowside-output transistor T2 is turned on by the signal provided from the lowside-control circuit 33. That is, the drive signal of low level is output form the highside-driver 14, when the driving current which turns the lowside-output transistor T2 into on state, through the output terminal 27 of the lowside-control circuit 33. And, the drive signal of high level is output from the highside-driver 14, when the driving current which drives the lowside-output transistor T2, through the output terminal 27 of the lowside-control circuit 33, is not output. As this result, it is controlled such that the pMOS switching element Q3 is turned on, when the lowside-output transistor T2 turns on, and is turned off, when the lowside-output transistor T2 turns off.

In the meantime, the timing of the signal provided by the lowside-driver 34 is adjusted to the timing of the signal. For example, the timing of the drive signal is synchronized with the timing when the highside-output transistor T1 turns on. That is, the timing of the signal provided by the lowside-driver 34 is adjusted to the timing of the signal provided by the highside-control circuit 13. The signal provided by the lowside-driver 34 forms the drive signal of the pMOS switching element Q4. The drive signal of low level is output, when the driving current which turns on the highside-output transistor T1, through the output terminal 27 of the highside-control circuit 13, from the lowside-driver 34. And, the drive signal of high level is output, when the driving current that turns off the highside-output transistor T1, through the output terminal 27 of the highside-control circuit 13, is output. As this result, it is controlled such that the pMOS switching element Q4 is turned on, when the highside-output transistor T1 turns on, and is turned off, when the highside-output transistor T1 turns off.

(Operation of Highside-Arm Circuit)

Figure 8:
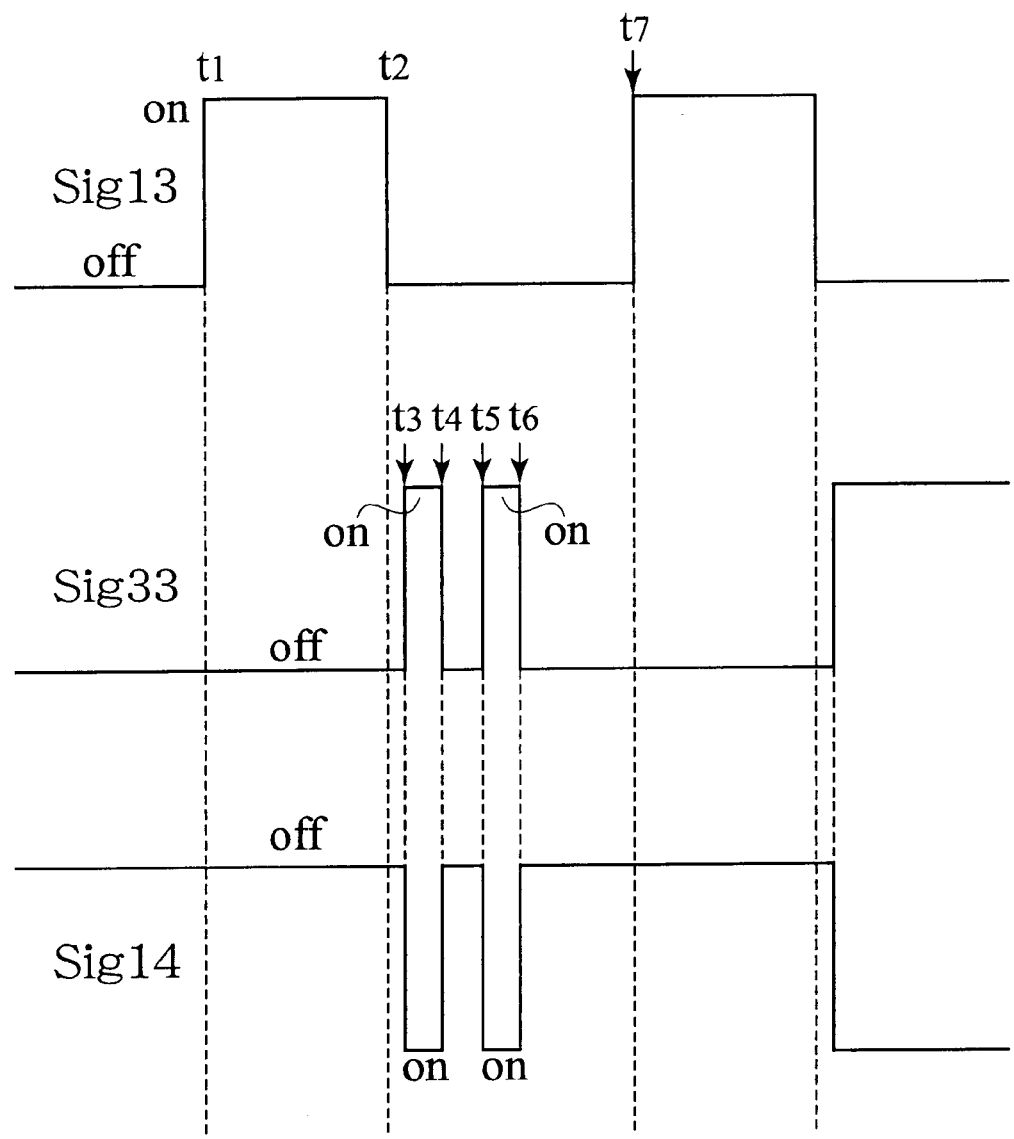
FIG. 8 is a time chart showing the mutual relation of the signals so as to explain the operation of the highside-arm circuit in the circuit configuration shown in FIG. 7.

FIG. 8 is a time chart for the output signal (Sig13) supplied from the highside-control circuit 13 through the output terminal 27, the output signal (Sig14) supplied from the highside-driver 14 for driving the pMOS switching element Q3 and the output signal (Sig33) supplied from the lowside-control circuit 33 through the output terminal 27.

(a) When the output signal (Sig13) of the high level is provided from the highside-control circuit 13, at the timing t1 shown in FIG. 8, the driving current flows into the base terminal of the highside-output transistor T1 so that the highside-output transistor T1 turns on in the forward direction. Therefore, the current flows in the direction shown by the arrow "Z" in FIG. 7. This time, the impedance between the base-ground terminals of the highside-output transistor T1 lowers by the action of the impedance adjustment circuit 12 in the highside-control circuit 13.

(b) Next, at the timing t2 shown in FIG. 8, when the highside-control circuit 13 provides the output signal (Sig13) of the low level such that the driving current does not flow into the base terminal of the highside-output transistor T1, the highside-output transistor T1 starts a turning off transition. The impedance between the base-ground terminals of the highside-output transistor T1 is kept low, by the action of the impedance adjustment circuit 12 in the highside-control circuit 13, for a specific interval after the output signal (Sig13) from the highside-control circuit 13 changes to low level so that the highside-output transistor T1 turns off. In this interval, by passing through the base terminal of the highside-output transistor T1, the charges stored in the highside-output transistor T1 are pulled out to the ground. The impedance between the base-ground terminals of the highside-output transistor T1 rises, when the discharge of capacitor C23 finishes (The capacitor C23 in the impedance adjustment circuit 12, is shown in FIG. 2, which is explained in the first embodiment).

(c) At the timing t3 shown in FIG. 8, when the lowside-control circuit 33 turns the lowside-output transistor T2 into on state from the off state, under the condition that the highside-output transistor T1 is still continuing the turn-off transition, by pulling out the charges stored in transistor T1, the current flows in the direction shown by the arrow "A" in FIG. 7.

(d) Afterwards, at the timing t4 in FIG. 8, the counter emf is generated in the inductive load L1, when the lowside-output transistor T2 is turned off by the lowside-control circuit 33, and the potential at node "P" shown in FIG. 7 rises by this counter emf. The bypass diode D3 is forward-biased, because the pMOS switching element Q3 is turned off by the action of the highside-driver 14, when the potential at the node "P" rises above the potential of the base terminal of the highside-output transistor T1, and the current flows in the direction shown by the arrow "C", and further by the arrow "E" in FIG. 7. Then, the current flows in the direction by the arrow "B" shown in FIG. 7, which is the reverse-direction, as a result of the high impedance between the base-ground terminals of the highside-output transistor T1. By turning on the highside-output transistor T1 in the reverse-direction, the current flows from the emitter to collector terminal of the highside-output transistor T1. In the steady state, the current which flows in the direction shown by the arrow "C"→"E" in FIG. 7, i.e., from the emitter to base terminal, becomes small.

(e) At the timing t5 shown in FIG. 8, when the signal which turns on the lowside-output transistor T2 is provided from the lowside-control circuit 33 again, under the condition that the return currents are flowing in the directions shown by the arrows "B" and "C" in FIG. 7, the output signal (Sig14) from the highside-driver 14 changes to low level so as to turn on the pMOS switching element Q3. The potential of the base terminal of the highside-output transistor T1 is made lower than that of the emitter terminal of the highside-output transistor T1 by the voltage power supply V21 connected through the pMOS switching element Q3. Therefore, in the direction shown by the arrow "F" in FIG. 7, the charges stored in the highside-output transistor T1 are quickly pulled out. Then, the lowside-output transistor T2 turns on. The highside-output transistor T1 shifts to the reverse recovery operation, when the lowside-output transistor T2 turns on. Though the impedance between the base-ground terminals of the highside-output transistor T1 is kept high, by turning on the pMOS switching element Q3, the charges stored in the highside-output transistor T1 are pulled out through the base terminal. As this result, the highside-output transistor T1 becomes off state, and the large through-current penetrating from the collector to emitter terminal of the highside-output transistor T1 does not flow.

(f) Afterwards, at the timing t6 in FIG. 8, when the lowside-control circuit 33 turns off the lowside-output transistor T2 again, the pMOS switching element Q3 is turned off, and similarly to the timing t4, the highside-output transistor T1 is turned on in the reverse-direction. Then, the return current flows from the emitter to collector terminal of the highside-output transistor T1.

(g) Next, at the timing t7 in FIG. 8, when the highside-control circuit 13 provides the output signal (Sig13) of high level, the driving current flows into the base terminal of the highside-output transistor T1. As this result, the operations equal to the timing t1 are repeated, and the highside-output transistor T1 turns on in the forward direction.

(Operation of Lowside-Arm Circuit)

Figure 9:
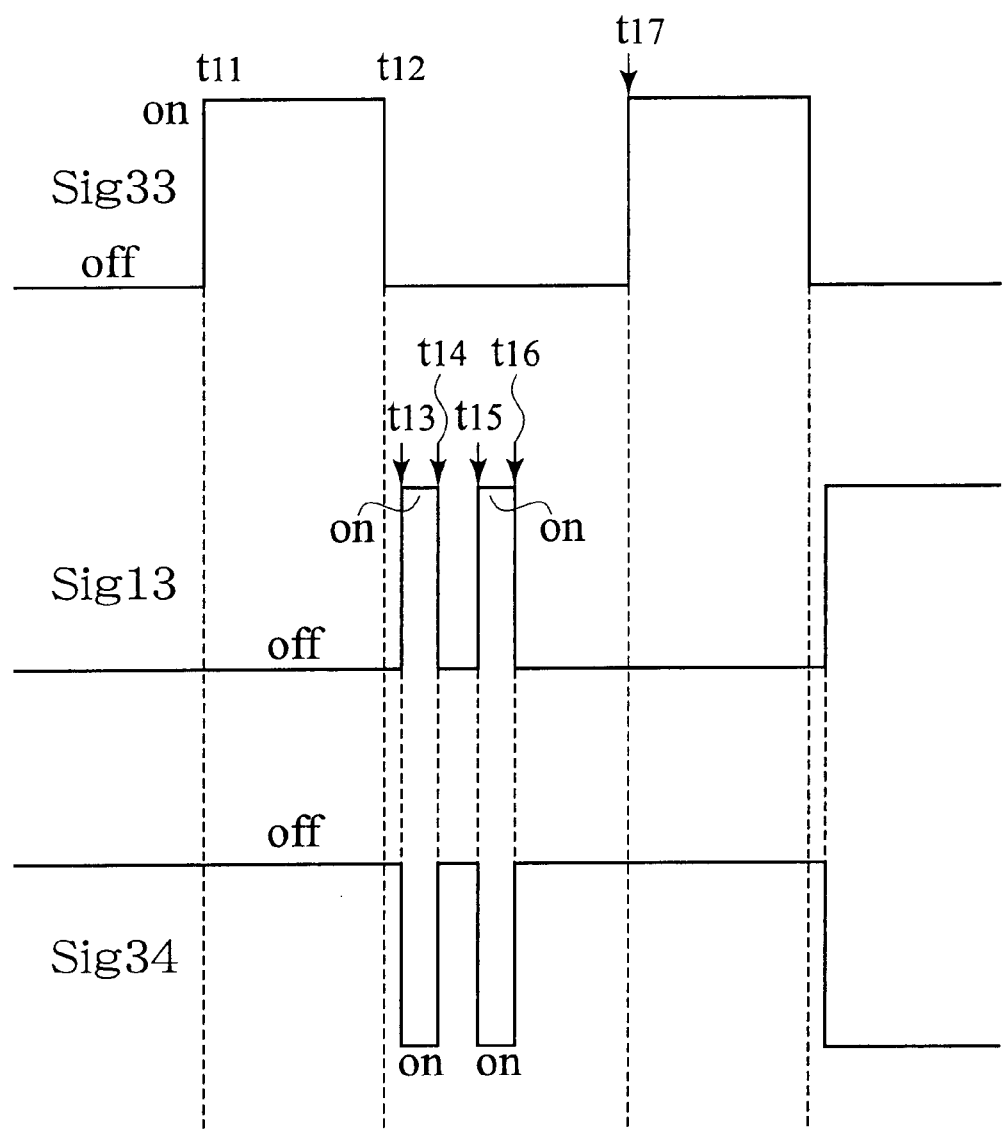
FIG. 9 is a time chart showing the mutual relation of the signals so as to explain the operation of the lowside-arm circuit in the circuit configuration shown in FIG. 7.
Figure 10:
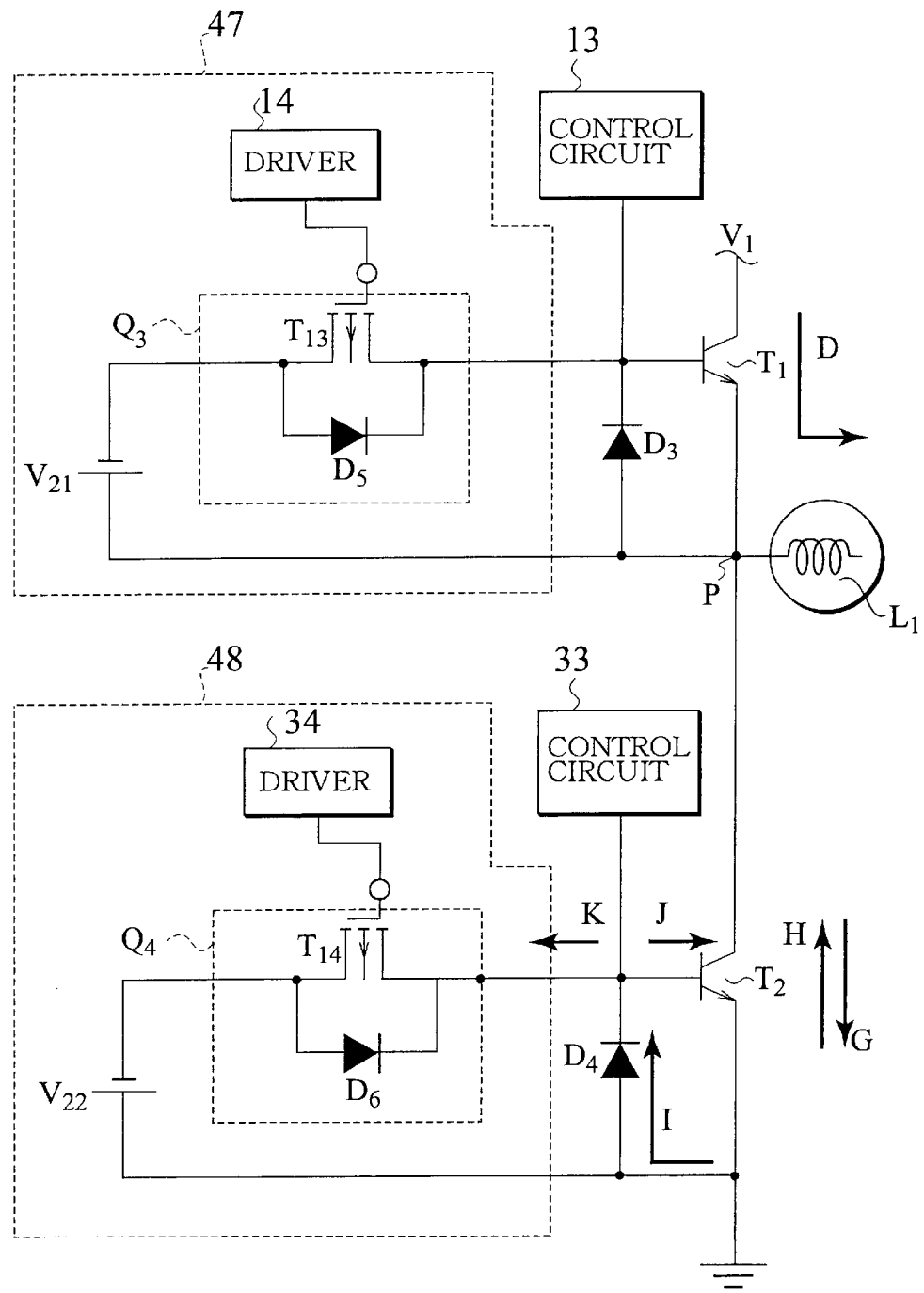
FIG. 10 is a circuit configuration of the protective control unit according to the third embodiment of the present invention, which shows respective current directions according to the time chart shown in FIG. 9.

FIG. 9 is a time chart for the output signal (Sig13) supplied from the highside-control circuit 13 through the output terminal 27, the output signal (Sig34) supplied from the lowside-driver 34 for driving the pMOS switching element Q4 and the output signal (Sig33) supplied from the lowside-control circuit 33 through the output terminal 27. FIG. 10 is a circuit configuration, which shows the respective current directions according to the time chart shown in FIG. 9.

(a) First, at the timing t11 shown in FIG. 9, when the output signal (Sig33) from the lowside-control circuit 33 becomes the high level, the driving current flows into the base terminal of the lowside-output transistor T2, and the lowside-output transistor T2 turns on in the forward direction. As this result, the current flows through the lowside-output transistor T2 in the direction shown by the arrow "G" in FIG. 10. This time, the impedance between the base-ground terminals of the lowside-output transistor T2 lowers by the action of the impedance adjustment circuit 12 in the lowside-control circuit 33.

(b) Next, at the timing t12 shown in FIG. 9, the lowside-control circuit 33 provides the output signal (Sig33) in low level, and the driving current does not flow into the base terminal of the lowside-output transistor T2, and the lowside-output transistor T2 is turned off. The low impedance condition between the base-ground terminals of the lowside-output transistor T2 is kept by the action of the impedance adjustment circuit 12 in the lowside-control circuit 33 for a specific interval, after the output signal (Sig33) from the lowside-control circuits 33 has changed to low level, that is, after the lowside-output transistor T2 has started the turn-off transition. In this interval, by passing through the base terminal of the lowside-output transistor T2, the charges stored in the lowside-output transistor T2 are pulled out to the ground. The impedance between the base-ground terminals of the lowside-output transistor T2 rises, when the discharge of the capacitor C23 in the impedance adjustment circuit 12 shown in FIG. 2 finishes, as already explained in the first embodiment.

(c) At the timing t13 as shown in FIG. 9, under the condition that the lowside-output transistor T2 is continuing the turn-off transition by pulling out the charges stored in transistor T2, when the highside-control circuit 13 turn the highside-output transistor T1 on from the off state, the current flows in the direction by the arrow "D" in FIG. 10.

(d) Afterwards, at the timing t14 as shown in FIG. 9, when the highside-control circuit 13 turns the highside-output transistor T1 off, the counter emf is generated in the inductive load L1. The potential at node "P" shown in FIG. 10 falls by this counter emf. The potential of the base terminal of the lowside-output transistor T2 lowers below the potential at the emitter terminal, when the potential at node "P" lowers below the ground potential, or below the potential at the emitter terminal of the lowside-output transistor T2. The forward-biasing of the bypass diode D4 is done, because the pMOS switching element Q4 is kept in the off state by the action of the lowside-driver 34, and the current flows in the directions shown by the arrow "I"→"J" shown in FIG. 10. Then, the lowside-output transistor T2 turns on in the reverse-direction as a result of the high impedance between the base-ground terminals of the lowside-output transistor T2. Therefore, the current flows in the direction shown by the arrow "H" in FIG. 10. The reverse-directional current flows from the emitter to collector terminal of the lowside-output transistor T2. In the steady state, the current flows mainly along the direction shown by the arrow "H" in FIG. 10, and the currents flowing along the directions shown by the arrows "I"→"J" in FIG. 10, i.e., from the emitter to base terminal is slight.

(e) Under the condition that the return current is still flowing along the directions shown by the arrows "H" and "I", at the timing t15 as shown in FIG. 9, when the highside-output transistor T1 is turned on again, by the signal of high level from the highside-control circuit 13, the output signal (Sig34) from the lowside-driver 34 becomes low level, and the pMOS switching element Q4 is turned on. The potential of the base terminal of the lowside-output transistor T2 is made lower than that of the emitter terminal of the lowside-output transistor T2 by the voltage power supply V22 connected through the pMOS switching element Q4. Therefore, the charges stored in the lowside-output transistor T2 are quickly pulled out along the direction shown by the arrow "K" in FIG. 10. Then, the highside-output transistor T1 turns on.

(f) The lowside-output transistor T2 shifts to the reverse recovery operation, when the highside-output transistor T1 turns on. Though the impedance between the base-ground terminals of the lowside-output transistor T2 is kept high, by turning on the pMOS switching element Q4, the charges stored in the lowside-output transistor T2 are pulled out through the base terminal. As this result, the lowside-output transistor T2 becomes off state, and the large through-current penetrating from the collector to emitter terminal of the lowside-output transistor T2 does not flow.

(g) Afterwards, at the timing t16 shown in FIG. 9, the pMOS switching element Q4 is turned off, when the highside-control circuit 13 turns off again the highside-output transistor T1. And similarly to the timing t14, the lowside-output transistor T2 is turned on in the reverse-direction. Then the current flows from the emitter to collector terminal in the lowside-output transistor T2.

(h) Next, at the timing t17 shown in FIG. 9, when the lowside-control circuit 33 provides the output signal (Sig33) of high level, the driving current flows into the base terminal of the lowside-output transistor T2. As this result, the operations equal to the timing t11 are repeated, turning on the lowside-output transistor T2 in the forward direction.

(1) According to the third embodiment of the present invention, the charges stored in the highside-output transistor T1 and the lowside-output transistor T2 are quickly pulled out by the voltage power supplies V21 and V22 through the base terminals, and the highside-output transistor T1 and the lowside-output transistor T2 are safely made to be in the off state. As this result, the large through-current flowing from the collector to emitter terminal of the highside-output transistor T1 or the lowside-output transistor T2 is effectively prevented, and there is no useless power dissipation. In addition, the destruction of the opposing output transistor, which is not in the reverse recovery state operation, due to the through-current by the other opposing output transistor is prevented. And, the turn-off time of the highside-output transistor T1 or the lowside-output transistor T2 is shortened, because the storage charges are quickly pulled out through the base terminal from collector region of the highside-output transistor T1 or the lowside-output transistor T2.

(2) Because the circuit topologies of the highside-arm and lowside-arm are made to be symmetrical, the technical advantages stated in (1) are also obtained for both current directions "A" and "D" flowing in the inductive load L1 in FIG. 7 and FIG. 10.

(3) Due to the impedance adjustment circuit 12 in the highside-control circuit 13 and the lowside-control circuit 33, the on state of the npn bipolar transistor T24 is maintained for a specific interval, after the npn bipolar transistor T21 of switching circuits of 11 turns off. Therefore, the low impedance conditions, between the base-ground terminals of the highside-output transistor T1 and the lowside-output transistor T2, are maintained for the specific period. As this result, the turn-off times of the highside-output transistor T1 and the lowside-output transistor T2 are shortened, because the charges stored in the highside-output transistor T1 and the lowside-output transistor T2 can be pulled out quickly through the base regions.

In the description of the third embodiment, the series circuit of the pMOS switching element Q3 and the negative voltage power supply V21 is inserted between the emitter and base terminals of the highside-output transistor T1. Similarly, the series circuit of the pMOS switching element Q4 and the negative voltage power supply V22 is inserted between the emitter and base terminals of the lowside-output transistor T2. And the on/off timing of the pMOS switching elements Q3 and Q4 are synchronized with corresponding on/off timing of the highside-output transistor T1 and the lowside-output transistor T2, respectively. However, it is also possible to employ a circuit topology, in which only one of the highside-output transistor T1 or the lowside-output transistor T2 has the pMOS switching element Q3 or Q4, between the emitter and base terminals of the output transistor T1 or T2, and the pMOS switching element turns off/on according to the off/on operation of the corresponding output transistor T1 or T2. In this case, it can be prevented that the other output transistor, which is not connected to the pMOS switching element, is destroyed by the through-current, because the through-current does not flow in the output transistors to which the pMOS switching element and the voltage power supply is connected.

And, though in FIG. 7 and FIG. 10, the single bypass diode D3 or D4 is respectively employed, plural diodes can be connected between the emitter and base terminals of the highside-output transistor T1 or between the emitter and base terminals of the lowside-output transistor T2. In FIG. 7 and FIG. 10, the negative voltage, which made the potential level of the emitter terminal of the highside-output transistor T1 or the lowside-output transistor T2 as the reference, is respectively applied to the base terminal of the highside-output transistor T1 or the lowside-output transistor T2, by the voltage power supply V21 or V22. By forward-biasing the bypass diode D3 or D4, when the potential applied to the base terminal becomes below the forward voltage drop of the bypass diode D3 or D4, the potential of the base terminal is clamped by the forward voltage drop. By constituting the bypass diode D3 or D4 by multiple diodes connected in series, it is possible to lower the potential of the base terminal further. As this result, the turn-off time of the highside-output transistor T1 or the lowside-output transistor T2 is shortened, as the speed, pulling out the charges stored in the highside-output transistor T1 or the lowside-output transistor T2 via base terminal increases.

Though in the description of the third embodiment, the pMOS switching element Q3 and Q4 are used, other switching elements or circuits, such as the transfer gates and nMOS switching elements can also employed. However, it is necessary to cut off the current flowing in the direction shown by the arrow "F" in FIG. 7 or "K" in FIG. 10, having same function of the integral body diode D5 or D6.

(Fourth Embodiment)

In the third embodiment, the charges stored in the highside-output transistor T1 were pulled out through the base terminal of the highside-output transistor T1, using the negative voltage power supply V21. And, the charges stored in the lowside-output transistor T2 were pulled out through the base terminal of the lowside-output transistor T2, using the negative voltage power supply V22. In the fourth embodiment, the feature that discharging and charging of capacitor C are used instead of the voltage power supplies V21 and V22 is different from the third embodiment. Still, in the fourth embodiment of the present invention, only highside-arm circuit is explained, because circuit topologies and functions of the highside-arm circuit and the lowside-arm are symmetrical.

Figure 11A:
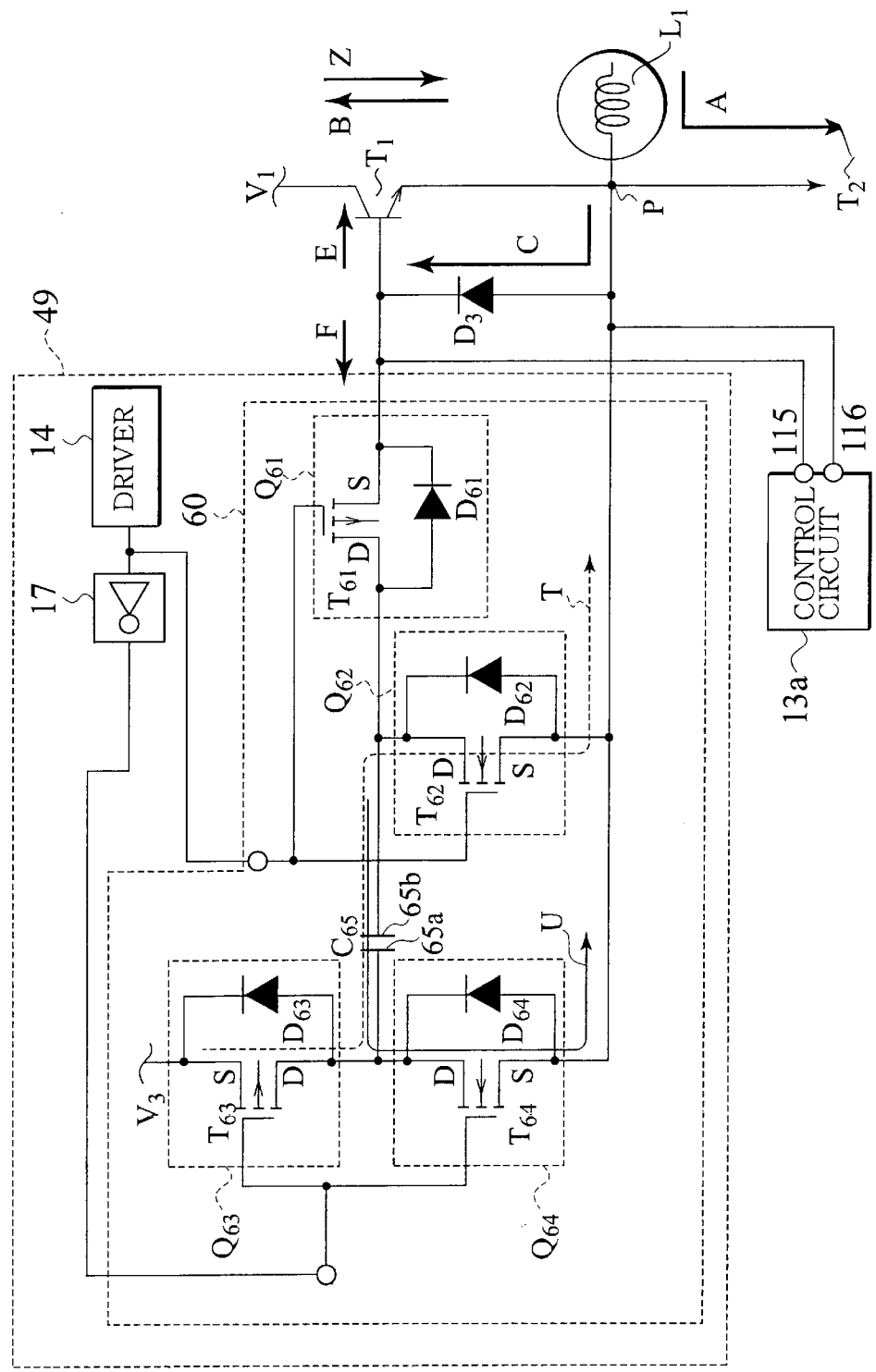
FIG. 11A is a circuit configuration of a protective control unit according to a fourth embodiment of the present invention. Here, the lowside-arm circuit is omitted, and it shows only the highside-arm circuit in FIG. 11A.

FIG. 11A is a circuit configuration of the protective control unit according to the fourth embodiment, and the lowside-arm is omitted as stated above. The base terminals of the highside-output transistor T1 is connected to a highside-drive circuit 49, and the base terminals of the lowside-output transistor T2 is connected to a lowside-drive circuit (omitted). The highside-drive circuit 49 pulls out charges stored in the highside-output transistor T1, through the first control electrode of the highside-output transistor T1, during the periods when the highside-output transistor is in the end of reverse conducting state and reverse recovery state. The highside-drive circuit 49 serves as claimed charge removing means in the present invention, which pulls out charges stored in the highside-output transistor T1, through the first control electrode, during the periods when the highside-output transistor is in the end of reverse conducting state and reverse recovery state. Similarly, the lowside-drive circuit (omitted) pulls out charges stored in the lowside-output transistor T2 through the second control electrode of the lowside-output transistor T2, during the periods when the lowside-output transistor is in the end of reverse conducting state and reverse recovery state.

The highside-drive circuit 49 has a discharge/charge circuit 60, an inversion circuit 17 connected to the discharge/ charge circuit 60, and a highside-driver 14 connected to the inversion circuit 17 as shown in FIG. 11A. The discharge/charge circuit 60 is connected between the base and emitter terminals of the highside-output transistor T1. Further, a bypass diode D3 is connected between the base and emitter terminals of the highside-output transistor T1, in parallel with the discharge/charge circuit 60.

(Discharge/Charge Circuit)

The discharge/charge circuit 60 contains a pMOS switching element (highside-switching element) 61, a pMOS switching element (a first switching element) 63, a nMOS switching element (a second switching element) 64, a nMOS switching element (a third switching element) 62, a capacitor C65 and a positive voltage power supply (a constant voltage power supply) V3. The pMOS switching element (a first switching element) 63 and the nMOS switching element (a second switching element) 64 constitute a complimentary inverter, which is known as a CMOS inverter. The complimentary inverter (CMOS inverter) is connected between the constant voltage power supply V3 and a node "P", or the connecting point between the highside-output transistor T1 and the lowside-output transistor T2. The capacitor C65 has a first capacitor electrode 65a connected to an output of the complimentary inverter (CMOS inverter) and a second capacitor electrode 65b, facing to the first capacitor electrode 65a. The third switching element Q62 is connected between the second capacitor electrode 65b and the node "P".

The positive voltage power supply V3 generates at the second capacitor electrode 65b of the capacitor C65 a transient supply voltage, which is negative taking the potential at the emitter terminal of the highside-output transistor T1 as a reference potential, and it is used in the floating state against the ground potential. And, parasitic body diodes D61~64 are parallelly connected with MOS transistors T61~T64 as the main devices of MOS switch elements 61~64, respectively. The parasitic body diodes D61~64 are structurally integrated with corresponding MOS transistors T61~T64. The pMOS switching element 61 and the nMOS switching element 62 are controlled by the highside-driver 14, which is substantially equal to the circuit explained in the third embodiment. The pMOS switching element 63 and the nMOS switching element 64 are controlled by the output signal from the inversion circuit 17, which inverts the polarity of drive signal provided by the highside-driver 14.

The operation of the discharge/charge circuit 60 is explained. In the condition that the pMOS switching element 63 and the nMOS switching element 62 are on state, while the pMOS switching element 61 and the nMOS switching element 64 are off sate, the current flows along the direction shown by the arrow "T" in FIG. 11A, by the voltage power supply V3 so as to charge the capacitor C65. This time, the positive charge of the specified amount is stored at the first capacitor electrode 65a of the capacitor C65, and the negative charge of the specified amount is stored at the second capacitor electrode 65b. Under the condition that the capacitor C65 is charged, and the pMOS switching element 63 and the nMOS switching element 62 turn off, and the pMOS switching element 61 and the nMOS switching element 64 turn on, the charges stored in the capacitor C65 flow along the direction shown by the arrow "U" in FIG. 11A. This time, the current flows from the base terminal of the highside-output transistor T1 along the direction shown by the arrow "F" in FIG. 11A. The current flows in the direction shown by the arrow "U" and "F", until the discharge of the capacitor C65 ends.

(Highside-Control Circuit)

Figure 11B:
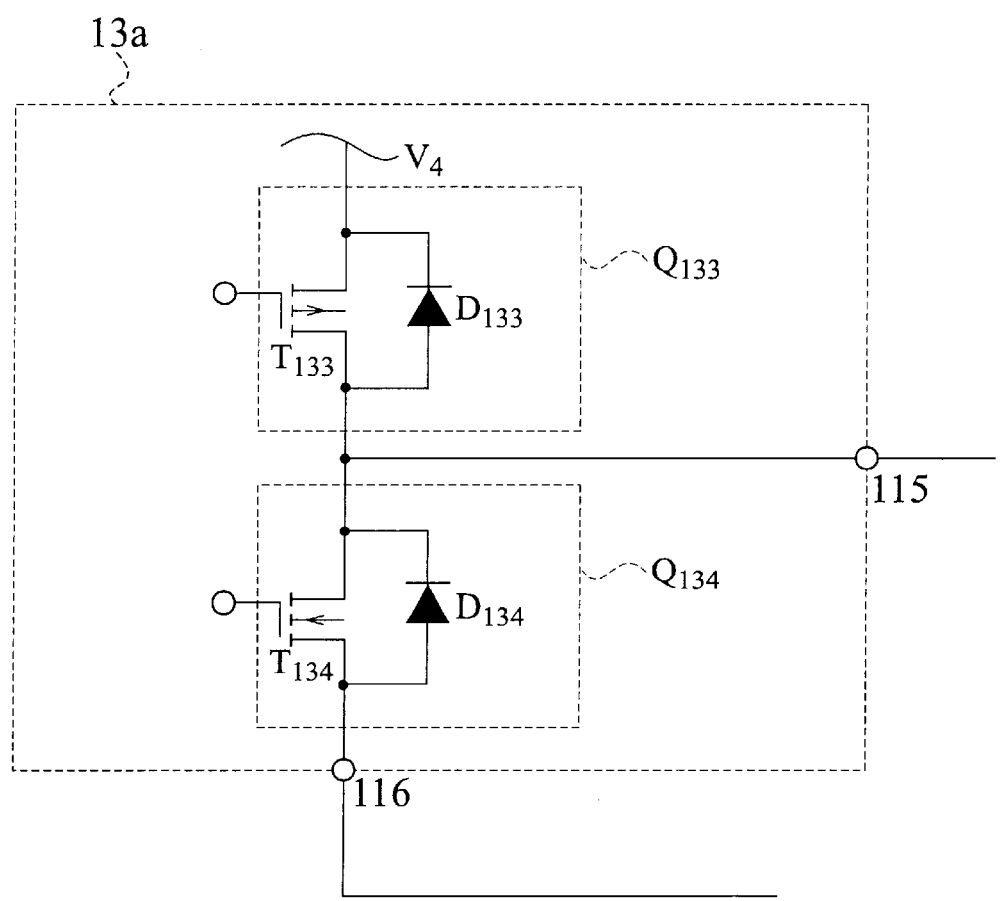
FIG. 11B is a circuit configuration which show the details of a highside-control circuit in the protective control unit according to the fourth embodiment of the present invention.

A highside-control circuit 13a shown in FIG. 11A is the circuit, which replaces the highside-control circuit 13 in the third embodiment. The details of the highside-control circuit 13a is shown in FIG. 11B. The highside-control circuit 13a turns off and on the highside-output transistor T1, similar to the highside-control circuit 13 explained in the third embodiment. The floating state of the highside-control circuit 13a is maintained against the ground potential. The highside-control circuit 13a contains a positive voltage power supply V4, which provide a supply voltage in respect of a reference potential defined as the potential at the emitter terminal of the highside-output transistor T1, a pMOS switching element 133 and a nMOS switching element 134. In the pMOS switching element 133 and the nMOS switching element 134, the parasitic body diodes D133 and D134 are respectively integrated structurally with a pMOS transistors T133 and a nMOS transistor T134, which serves as main devices of the pMOS switching element 133 and the nMOS switching element 134. A higher potential output terminal 115 of the highside-control circuit 13a is connected to the base terminal of the highside-output transistor T1, and a lower potential output terminal 116 of the highside-control circuit 13a is connected to the emitter terminal of the highside-output transistor T1. In the highside-control circuit 13a, if the pMOS switching element 133 turns on, and the nMOS switching element 134 turns off, the highside-output transistor T1 is turned on.

(Operation of Protective Control Unit)

By referring to time chart shown in FIG. 8 again, which was already explained in the third embodiment, the operation of the protective control unit of the fourth embodiment is explained. In the fourth embodiment, the output signal (Sig13) explained as signal from the highside-control circuit 13 shown in FIG. 8 is replaced by the output signal provided, through the output terminal 115, from the highside-control circuit 13a.

(a) First, at the timing t1 shown in FIG. 8, when the output signal (Sig13) of high level is provided, the driving current flows into the base terminal of the highside-output transistor T1, so as to turn on the highside-output transistor T1 in the forward direction, in which current flows along the direction shown by the arrow "Z" in FIG. 11A. In this time, in the discharge/charge circuit 60, the current flows along the direction shown by the arrow "T" in FIG. 11A, and the current charges the capacitor C65.

(b) At the timing t2 shown in FIG. 8, when the highside-control circuit 13a provide the output signal (Sig13) of low level, the driving current cannot flow into the base terminal of the highside-output transistor T1, and the highside-output transistor T1 starts turn-off transition.

(c) Under the condition that the highside-output transistor T1 is continuing the turn-off transition, at the timing t3 shown in FIG. 8, when the lowside-output transistor T2 turns on, the current flows along the direction shown by the arrow "A" in FIG. 11A.

(d) At the timing t4 shown in FIG. 8, when the lowside-output transistor T2 turn off, the counter emf is generated in the inductive load L1. The potential at node "P" shown in FIG. 11A rises by this counter emf. The bypass diode D3 is forward-biased, because the pMOS switching element 61 is turned off by the action of the highside-driver 14, when the potential at the node "P" rises above the potential of the base terminal of the highside-output transistor T1, and the current flows along the direction shown by the arrow "C"→"E" in FIG. 11A. As this result, the highside-output transistor T1 turns on in the reverse-direction. Therefore, the current flows along the direction shown by the arrow "B" shown in FIG. 11A. The reverse-directional current flows from the emitter to collector terminal of the highside-output transistor T1. In the steady state, the current flows mainly along the direction shown by the arrow "B" in FIG. 11A. The current which flows along the direction shown by the arrow "C"→"E", i.e. from the emitter to base terminal is slight. Still, the charge stored in the capacitor C65 is preserved, even if the potential at the node "P" changes, because the voltage power supply V3 is kept in the floating state.

(e) At the timing t5 shown in FIG. 8, when the lowside-output transistor T2 turn on again, under the condition that the return currents are still flowing along the directions shown by the arrows "B" and "C" in FIG. 11A, the output signal (Sig14) from the highside-driver 14 changes to the low level. Therefore, the pMOS switching element 61 turn into on state, and the nMOS switching element 62 become off state. In addition, by the action of the inversion circuit 17, the pMOS switching element 63 turns off, and the nMOS switching element 64 turns on. Because the base terminal of the highside-output transistor T1 is connected to the capacitor C65 through the pMOS switching element 61, the potential of the base terminal becomes lower than the emitter terminal of the highside-output transistor T1. Therefore, the charges stored in the highside-output transistor T1 are pulled out quickly in the direction as shown by the arrow "F" in FIG. 11A.

(f) The highside-output transistor T1 shifts to the reverse recovery operation, at the timing t5 shown in FIG. 8, when the lowside-output transistor T2 turns on. Since the current flows in the direction shown by the arrow "U" through the pMOS switching element 61, and in the direction shown by the arrow "F" in FIG. 11A, the charges stored in the highside-output transistor T1 are pulled out through the base terminal. As this result, the highside-output transistor T1 becomes off state, and the large through-current penetrating from the collector to emitter terminal of the highside-output transistor T1 does not flow.

(g) Afterwards, the pMOS switching element 61 turns off, at the timing t6 in FIG. 8, when the lowside-output transistor T2 turns off again. Therefore, the highside-output transistor T1 turns on in the reverse-direction similarly to the timing t4. Therefore, the return current flows from the emitter to collector terminal of the highside-output transistor T1.

(h) Next, at the timing t7 in FIG. 8, the highside-control circuit 13a provides the output signal (Sig13) of high level so that the driving current flows into the base terminal of the highside-output transistor T1. As this result, the operations equal to the timing t1 is repeated with the highside-output transistor T1, turning on in the forward direction.

(1) According to the fourth embodiment of the present invention, the charges stored in the highside-output transistor T1 are pulled out by the discharge of the capacitor C65 through the base terminal. Therefore, there is no charge, which stays in the collector region of the highside-output transistor T1, and the highside-output transistor T1 is made to be off state quickly. As this result, it is prevented that large through-current flows in the output transistor, and there is no useless power dissipation. The destruction of the lowside-output transistor T2, which is not operating in the reverse recovery state, due to the through-current flowing through the highside-output transistor T1 is also effectively prevented. And, the turn-off time of the highside-output transistor T1 is shortened, because the stored charges are quickly pulled out through the base terminal from collector region of the highside-output transistor T1.

(2) The manufacturing cost can be reduced, because the negative voltage power supply is not required, since the discharge/charge circuit 60, can pull out the stored charges in the highside-output transistor T1 effectively through the base terminal.

The highside-control circuit 13a in the forth embodiment can be omitted, if we substitute with the circuit constructed with the voltage power supply V3, the pMOS switching element 63 and the nMOS switching element 64 in the discharge/charge circuit 60. And, it is also possible to substitute the highside-control circuit 13a of the forth embodiment by the highside-control circuit 13 explained in the third embodiment.

The capacitance of the capacitor C65 in the discharge/charge circuit 60 is decided based on the voltage values of the voltage power supply V3 and the amount of charges (carriers) stored in the highside-output transistor T1, etc. In short, the discharge time of the discharge/charge circuit 60 is decided so that the highside-output transistor T1 becomes off state, when the lowside-output transistor T2 turns on, and capacitance of the capacitor C65 is decided according to the discharge time.

In the discharge/charge circuit 60, it is also possible to substitute the capacitor C65 with a junction capacitance of the pn junction diode. The node connecting to the pMOS switching element 63 and the nMOS switching element 64 shown in FIG. 11A is connected to the anode of the pn junction diode, and another node connecting to the pMOS switching element 61 and the nMOS switching element 62 is connected to a cathode of the pn junction diode. Then, injection of current in the forward direction of the pn junction diode corresponds to the charging of above-mentioned capacitor C65. The act driving the pn junction diode into the reverse recovery state corresponds to the discharge of above-mentioned the capacitor C65.

(Fifth Embodiment)

In the third and fourth embodiments, the charges stored in the highside-output transistor T1 are pulled out respectively by the negative voltage power supply V21 and the discharge/charge operation of the capacitor C65, through the base terminal of the highside-output transistor T1. In the fifth embodiment, the technical feature using the counter emf of the coil is different from those using the voltage power supply V21 or the capacitor C65. Still, only the highside-arm circuit, which drives the highside-output transistor T1, is explained, similar to the fourth embodiment.

Figure 12A:
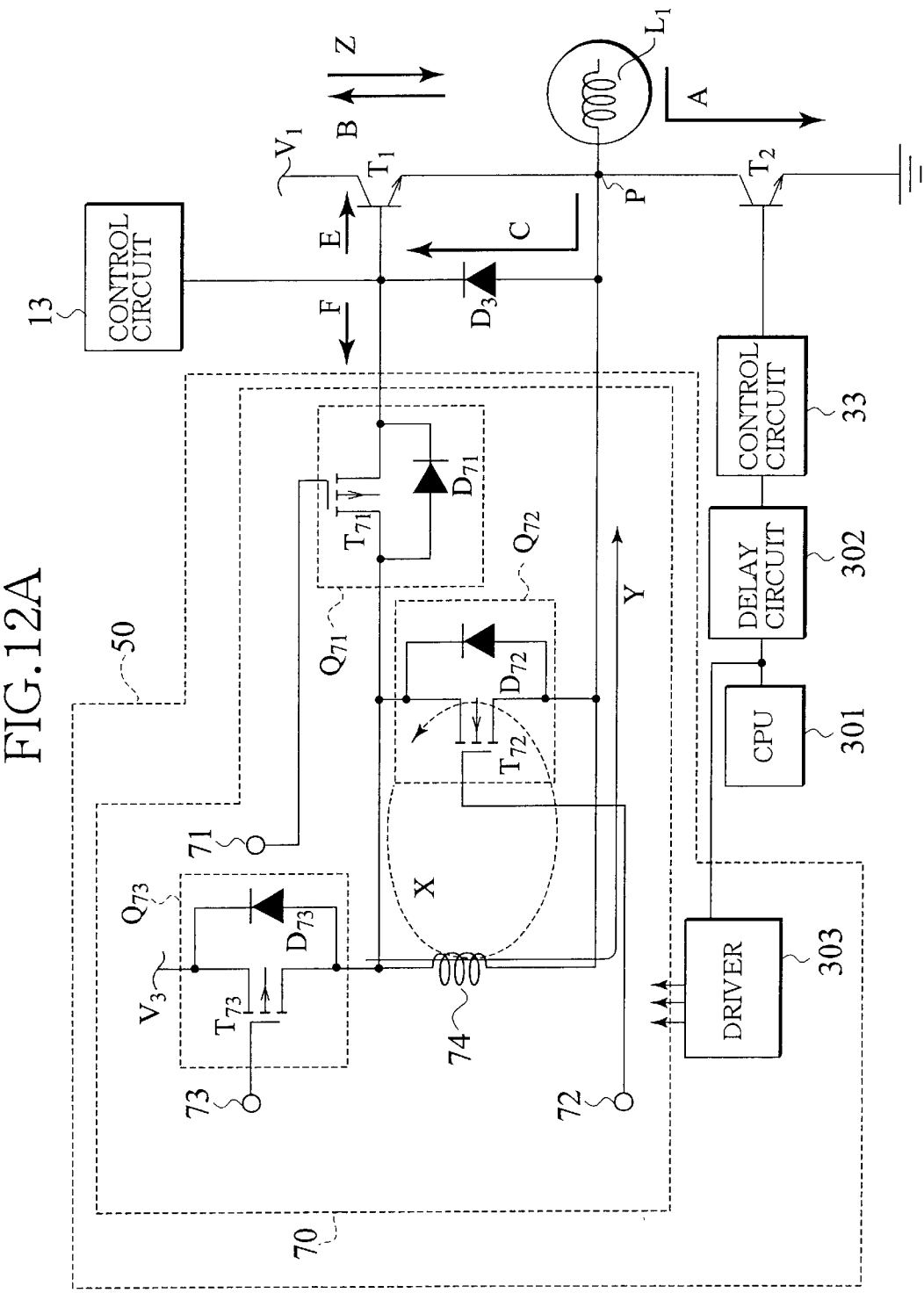
FIG. 12A is a circuit configuration of a protective control unit according to a fifth embodiment of the present invention, wherein the charge pull out circuit for the lowside-drive output transistor is omitted.

FIG. 12A is a circuit configuration of the protective control unit according to the fifth embodiment, and the charge pull out circuit for the lowside-output transistor T2 of the lowside-arm circuit is omitted. In FIG. 11A, the base terminals of the highside-output transistor T1 is connected to a highside-drive circuit 50, and the base terminals of the lowside-output transistor T2 is connected to a control circuit 33. The highside-drive circuit 50 pulls out charges stored in the highside-output transistor T1, through the first control electrode of the highside-output transistor T1, during the periods when the highside-output transistor is in the end of reverse conducting state and reverse recovery state. The highside-drive circuit 50 has a pull out circuit 70, and a driver (highside-driver) 303 connected to the pull out circuit 70 as shown in FIG. 11A. The highside-drive circuit 50 serves as claimed charge removing means in the present invention, which pulls out charges stored in the highside-output transistor T1, through the first control electrode, during the periods when the highside-output transistor is in the end of reverse conducting state and reverse recovery state. Further, a bypass diode D3 is connected between the base and emitter terminals of the highside-output transistor T1, in parallel with the pull out circuit 70. Namely, the pull out circuit 70 is connected between the base and emitter terminals of the highside-output transistor T1.

(Pull Out Circuit)

The pull out circuit 70 contains a pMOS switching element (a highside-switching element) Q71, a pMOS switching element (a first switching element) Q73, a nMOS switching element (a second switching element) Q72, a coil 74 and a positive voltage power supply (a constant voltage power supply) V3. The first switching element Q73 is connected to the constant voltage power supply V3. The coil 74 has a first coil terminal connected to the first switching element Q73 and a second coil terminal. The second switching element Q72 is connected between the first coil terminal and a node "P", or the connecting point between the highside-output transistor T1 and the lowside-output transistor T2. The highside-switching element Q71 is configured to control an electrical path between the first coil terminal and base terminal (the first control electrode) of the highside-output transistor T1.

The positive voltage power supply V3 generates at the first coil terminal of the coil 74 a transient supply voltage, which is negative taking the potential at the emitter terminal of the highside-output transistor T1 as a reference potential, and it is used in the floating state against the ground potential. And, the parasitic body diodes D71~73 are structurally merged with a pMOS transistor T71, a nMOS transistor T72 and a pMOS transistor T73, which serve as main devices of the MOS switch elements 71~73, respectively. The parasitic body diodes D71~D73 are connected with the pMOS transistor T71, the nMOS transistor T72 and the pMOS transistor T73 in parallel. The pMOS switching element 71, the nMOS switching element 72 and the pMOS switching element 73 are respectively controlled by a driver 303.

A highside-control circuit 13 shown in FIG. 12A is equal to the highside-control circuit 13 explained in the third embodiment, and drives the highside-output transistor T1. Similarly, the lowside-control circuit 33 shown in FIG. 12A is equal to the lowside-control circuit 33 explained in the third embodiment, and drives the lowside-output transistor T2. The lowside-control circuit 33 drives the lowside-output transistor T2 based on the timing of drive signal supplied from a the drive signal instruction unit 301. The drive signal instruction unit 301 may be constructed with a central processing unit (CPU), etc.

Figure 12B:
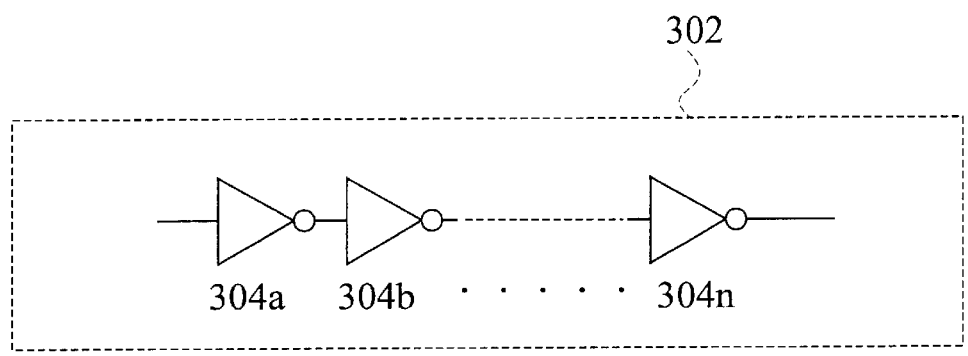
FIG. 12B is a circuit configuration of a delay circuit in the protective control unit according to the fifth embodiment of the present invention.

A fixed delay is given to the timing of the signals from the lowside-control circuit 33 for driving the lowside-output transistor T2 compared with the timing of the signals supplied from the drive signal instruction unit 301 of CPU's, etc.. For example, the delay circuit 302 shown in FIG. 12B gives the fixed delay against the timing of the signals supplied from the drive signal instruction unit 301. The delay circuit 302 shown in FIG. 12B is constitutes by multiple gate circuits 304a, 304b . . . 304n, connected in series. For example, each of the multiple gate circuits 304a, 304b, 304n, may be an inverter.

Figure 12C:
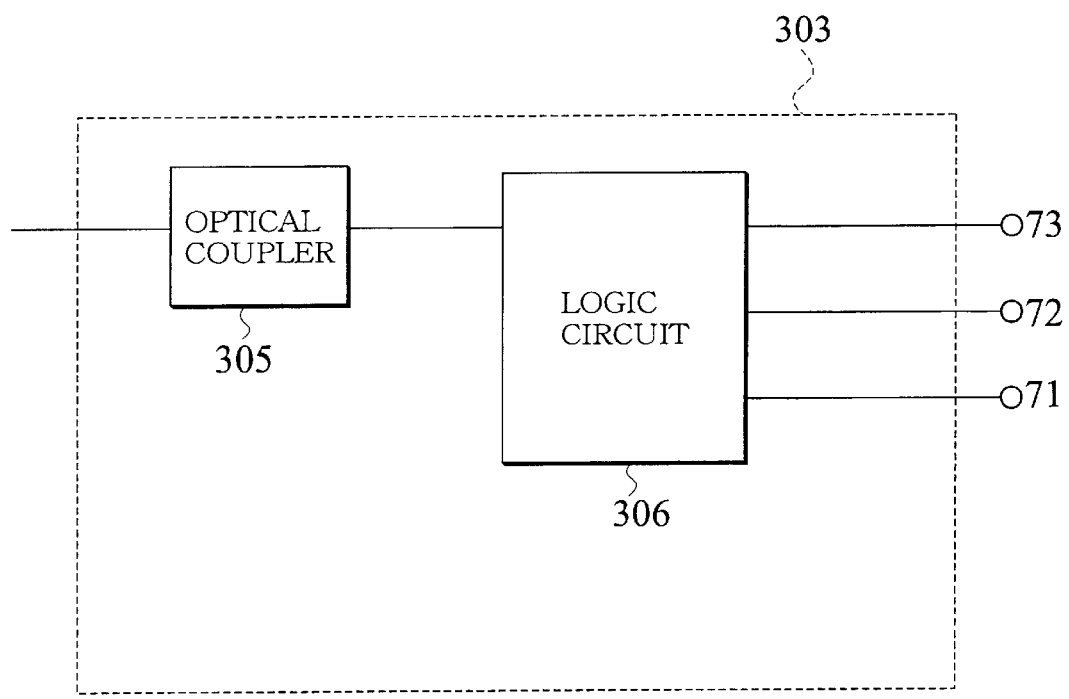
FIG. 12C is a circuit configuration of a gate control circuit in the protective control unit according to the fifth embodiment of the present invention.

In the meantime, the driver 303 shown in FIG. 12C uses the timing supplied from the drive signal instruction unit 301 as it is, and it forms the control signal that controls the pMOS switching element 71, the nMOS switching element 72 and the pMOS switching element 73, respectively turning on and off. That is to say, it is possible to provide control signals for the MOS switch elements 71~73 by the driver 303 having timing earlier than the timing of the drive signal of the lowside-output transistor T2, because there are no delay by the delay circuit 302.

The driver 303 shown in FIG. 12C is a circuit connected both to the highside-arm circuit and the lowside-arm circuit, which operate at different supply voltages, to each other. Therefore, the driver 303 has an optical coupler 305 and a logic circuit 306 connected to the optical coupler 305. The optical coupler 305 electrically isolates the highside-arm circuit and the lowside-arm circuit. That is, the electric signals from the lowside-arm circuit and the electric signals from the highside-arm circuit are mutually isolated by the optical coupler 305. The logic circuit 306 provides respective control signals for the MOS switch elements 71~73, using the timing signal provided from the drive signal instruction unit (CPU) 301. The signals provided by the drive signal instruction unit (CPU) 301 are electrically isolated by the optical coupler 305 and fed to the logic circuit 306.

(Operation of Pull Out Circuit)

The operation of the pull out circuit 70 is explained. When the pMOS switching element 73 is turned on, while the pMOS switching element 71 and the nMOS switching element 72 are turned off, the current flows along the direction shown by the arrow "Y" in FIG. 12A, from the voltage power supply V3, and an electric energy is stored in the coil 74. Under the condition that the current is flowing in the coil 74, when the pMOS switching elements 71 and 73 are both turned off, while the nMOS switching element 72 is turned on, the current due to the counter emf in the coil 74 flows along the direction shown by the arrow "X" in FIG. 12A.

While the current is flowing along the direction shown by the arrow "X" in FIG. 12A, when the pMOS switching element 71 turns on, and the pMOS switching element 73 and the nMOS switching element 72 turn off, the current flows along the direction shown by the arrow "Y" in FIG. 12A, from the base terminal of the highside-output transistor T1. This time, the current flows from the base terminal of the highside-output transistor T1 along the direction shown by the arrow "F" in FIG. 12A. The current continues to flow in the directions shown by the arrows "Y" and "F" until the emission of the energy stored in the coil 74 completes.

(Operation of Protective Control Unit)

Figure 13:
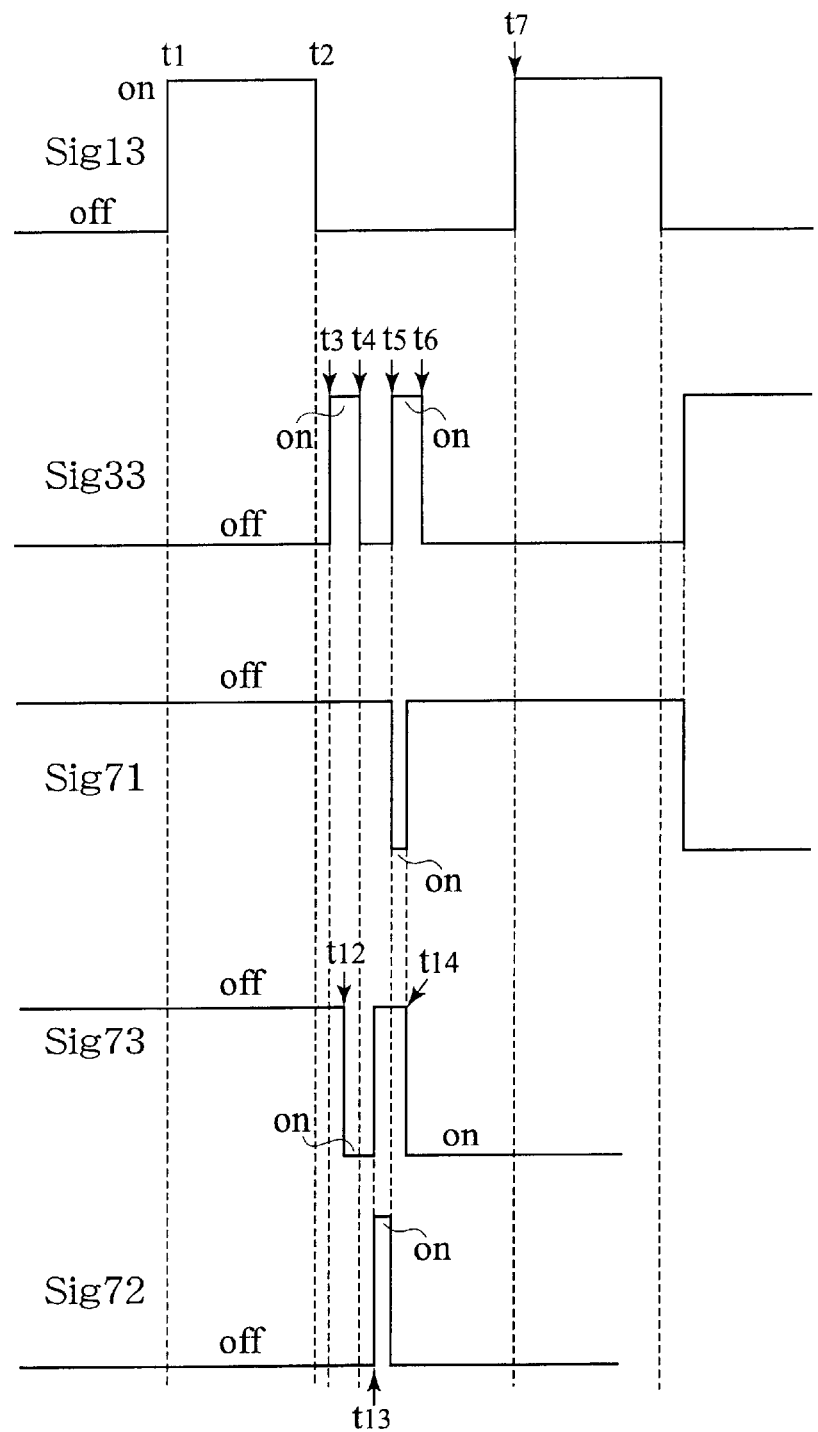
FIG. 13 is a time chart showing the mutual relation of the signals so as to explain the operation of the highside-arm circuit in the circuit configuration shown in FIG. 12A.

By referring to the time chart shown in FIG. 13, the operation of the protective control unit according to the fifth embodiment is explained. FIG. 13 is a time chart for the output signal (Sig13) supplied from the highside-control circuit 13, the output signal (Sig33) supplied from the lowside-control circuit 33, the output signal (Sig71) supplied from the driver 303, the output signal (Sig72) supplied from the driver 303 and the output signal (Sig73) supplied from the driver 303. Inputting the output signal (Sig71) to the terminal 71 of the pull out circuit 70, the pMOS switching element 71 is controlled to turn on and off. Inputting the output signal (Sig73) to the terminal 73 of the pull out circuit 70, the pMOS switching element 73 is controlled to turn on and off. And, inputting the output signal (Sig72) to the terminal 72 of the pull out circuit 70, the nMOS switching element 72 is controlled to turn on and off.

(a) First, at the timing t1 of FIG. 13, when the output signal (Sig13) having high level is provided from the highside-control circuit 13, the driving current flows into the base terminal of the highside-output transistor T1, and the highside-output transistor T1 turns on in the forward direction. Therefore, the current flows along the direction shown by the arrow "Z" in FIG. 12A.

(b) Next, at the timing t2 shown in FIG. 13, the output signal (Sig13) of low level is provided from the highside-control circuit 13, and the driving current does not flow into the base terminal of the highside-output transistor T1, and the highside-output transistor T1 is turned off.

(c) Next, at the timing t3 shown in FIG. 13, when the lowside-output transistor T2 turns on by the output signal (Sig33) supplied from the lowside-control circuit 33, the current flows along the direction shown by the arrow "A" shown in FIG. 12A.

(d) The pMOS switching element 71 and the nMOS switching element 72 are kept in the off state at the timing t12 prior to the timing t4, as shown in FIG. 13. At the timing t12, the lowside-output transistor T2 is also kept in the on state by the output signal (Sig33) as shown in FIG. 13. Then, at this timing t12, the pMOS switching element 73 is turned on by the output signal (Sig73). This time, from the voltage power supply V3, the current flows into the coil 74 of the pull out circuit 70, and the electric energy is stored in the coil 74.

(e) Then, at the timing t4 shown in FIG. 13, when the lowside-output transistor T2 is turned off by the output signal (Sig33) supplied from the lowside-control circuit 33, the counter emf is generated in the inductive load L1. The potential at node "P" shown in FIG. 12A rises by this counter emf. The bypass diode D3 is forward-biased, because the pMOS switching element 71 is kept in off state by the action of the driver 303, when the potential at the node "P" rises above the potential of the base terminal of the highside-output transistor T1, and the current flows along the direction shown by the arrow "C"→"E" in FIG. 12A. As this result, the current flows along the direction shown by the arrow "B" in FIG. 12A, by turning on the highside-output transistor T1 in the reverse-direction. Namely, the reverse current flows from the emitter to collector terminal. In the steady state, the current flows mainly along the direction shown by the arrow "B" in FIG. 12A, and the current flowing along the direction shown by the arrow "C"→"E", or from the emitter to base terminal is slight. Still, the energy stored in the coil 74 is preserved, even if the potential at the node "P" changes, because the voltage power supply V3 is operating under the floating state.

(f) The pMOS switching element 71 is still kept in the off state at the timing prior to the timing t5 shown in FIG. 13. And the pMOS switching element 73 are turned off by the output signal (Sig73) at the timing t13 prior to the timing t5 shown in FIG. 13. At the same timing t13, the nMOS switching element 72 is turned on by the output signal (Sig72). As this result, the current flows along the direction, due to the counter emf in the coil 74, as shown by the arrow "X" in FIG. 12A.

(g) Next, at the timing t5 in FIG. 13, the lowside-output transistor T2 is turned on again by the output signal (Sig33) supplied from the lowside-control circuit 33. At the timing equal to the output signal (Sig33), the output signal (Sig72) and the output signal (Sig71) from the driver 303 change to the low level as shown in FIG. 13. By the change of these signals, the pMOS switching element 71 turns on, and the nMOS switching element 72 turns off. The potential at the base terminal of the highside-output transistor T1 is made lower than the potential at the emitter terminal of the highside-output transistor T1 due to the counter emf of the coil 74 connected through the pMOS switching element 71. Therefore, the charges stored in the highside-output transistor T1 are quickly pulled out along the direction shown by the arrow "F" in FIG. 12A.

(h) The highside-output transistor T1 shifts to the reverse recovery operation, when the lowside-output transistor T2 turns on. Pulling out the charges stored in the highside-output transistor T1 through the base terminal, the current flows, through the pMOS switching element 71, along the direction shown by the arrow "Y" in FIG. 12A. As this result, the highside-output transistor T1 becomes off state, and the large through-current penetrating from the collector to emitter terminal of the highside-output transistor T1 does not flow.

(i) At the timing t14, the lowside-output transistor T2 is still keeping the on state, and the nMOS switching element 72 is kept in the off state as shown in FIG. 13. At this timing t14, the pMOS switching element 71 is turned off, and the pMOS switching element 73 is turned on. As this result, the energy is stored again in the coil 74.

(j) At the timing t6 shown in FIG. 13, when the lowside-output transistor T2 is turned off by the output signal (Sig33) supplied from the lowside-control circuit 33 again, the highside-output transistor T1 turns on in the reverse-direction, similar to the phenomena at the timing t4 shown in FIG. 13. Therefore, the return current flows from the emitter to collector terminal of the highside-output transistor T1.

(k) Next, at the timing t7 shown in FIG. 13, the output signal (Sig13) from the highside-control circuit 13 changes to high level, and the driving current flows into the base terminal of the highside-output transistor T1. As this result, the operations equal to the timing t1 are repeated with the highside-output transistor T1 turning on in the forward direction.

(1) According to the fifth embodiment of the present invention, there is no charge staying in the collector region, because the charges stored in the highside-output transistor T1 are pulled out, employing the counter emf of the coil 74, through the base terminal, and the highside-output transistor T1 is made to be off state. As this result, the reverse current is prevented from flowing. Then, it is prevented that large through-current flowing from the collector to emitter terminal of the highside-output transistor T1, and there is no useless power dissipation. In addition, the destruction of the lowside-output transistor T2, which is not operating at the reverse recovery state, by the through-current is prevented. And, the turn-off time of the highside-output transistor T1 is shortened, because the stored charges are quickly pulled out through the base terminal from collector region of the highside-output transistor T1.

(2) It is possible to reduce the manufacturing cost, because the pull out circuit 70 can be fabricated without using the negative voltage power supply. The inductance in the pull out circuit 70 of the coil 74 is decided based on the voltage values of the voltage power supply V3 and charge (carrier) quantities stored in the highside-output transistor T1, etc. In short, the operation time of the pull out circuit 70 is decided so that the highside-output transistor T1 may become off state, while the lowside-output transistor T2 turns on. Then, the inductance of the coil 74 is determined according to the operation time.

(Sixth Embodiment)

Figure 14A:
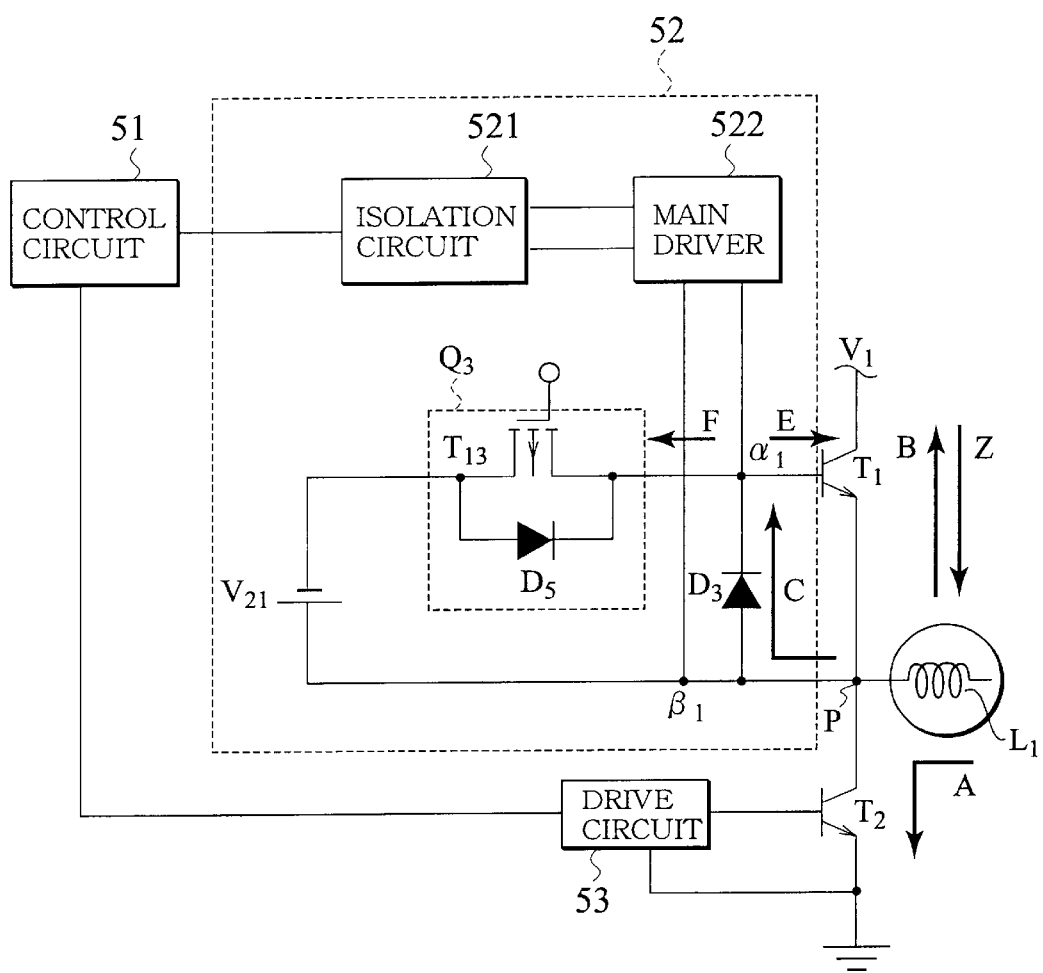
FIG. 14A is a circuit configuration of a protective control unit according to a sixth embodiment of the present invention, showing mainly a highside-driver.

FIG. 14A shows a part of H bridge circuit as an example of the protective control unit according to the sixth embodiment of the present invention. In FIG. 14A, the highside-output transistor T1 and the lowside-output transistor T2 are connected in series, such that the collector terminal of the lowside-output transistor T2 is connected to the emitter terminal of the highside-output transistor T1. The base terminals of the highside-output transistor T1 and the lowside-output transistor T2 are connected to a highside-drive circuit 52 and a lowside-drive circuit 53, respectively, so that they are driven by a control circuit 51. The highside-drive circuit 52 serves as claimed charge removing means in the present invention, which pulls out charges stored in the highside-output transistor T1, through the first control electrode, during the periods when the highside-output transistor is in the end of reverse conducting state and reverse recovery state. The conventional freewheeling diodes are not being connected between the collector-emitter terminals of the highside-output transistor T1 and the lowside-output transistor T2. A voltage power supply V1 is connected to the collector terminal of the highside-output transistor T1, and the emitter terminal of the lowside-output transistor T2 is grounded. The inductive load L1 is connected to the node "P", which is the connecting point between the emitter terminal of the highside-output transistor T1 and the collector terminal of the lowside-output transistor T2.

(Drive Circuit)

Focusing mainly to the explanations of the circuit configuration and the related operation of the highside-drive circuit 52, connected to the highside-output transistor T1, the feature of the sixth embodiment of the present invention will be explained.

Between the base and emitter terminals of the highside-output transistor T1 a bypass diode D3, whose dimension is smaller than the conventional freewheeling diode, is connected. Between the base-emitter terminals of the highside-output transistor T1, a series circuit having a negative voltage power supply V21 and a pMOS switching element Q3 is connected. The series circuit is connected with the bypass diode D3 in parallel. Further, the highside-drive circuit 52 has an isolation circuit 521 and a main driver 522. The main driver 522 is connected between the base-emitter terminals of the highside-output transistor T1, and the isolation circuit 521 is connected to the main driver 522, In the highside-arm circuit of the protective control unit according to the six embodiment, a reference potential is defined as the potential at the emitter terminal of the highside-output transistor T1. And the negative voltage power supply V21 supplies a required supply voltage in respect of the reference potential. The negative voltage power supply V21 operates in the floating state against the ground potential. Other switching circuits such as the transfer gate, or other switching element such as the nMOS switching element can be employed instead of the pMOS switching element Q3. However, it is necessary to similarly cut off the current flowing in the direction shown by the arrow "F" in FIG. 14A, or the direction of the body diode D5 of the pMOS switching element Q3 in FIG. 14A, as a function of the switching element.

The control circuit 51 generates the control signals. The control signals are transferred to the highside-drive circuit 52 and the lowside-drive circuit 53, respectively, so as to control the operations of the highside-drive circuit 52 and the lowside-drive circuit 53, according to the control signals. By receiving the control signal, in the highside-drive circuit 52, the isolation circuit 521 electrically isolates the control signal between the control circuit 51 and the main driver 522 to which the control circuit 51 is supposed to control. And the output signal of the isolation circuit 521 drives the main driver 522.

Figure 14B:
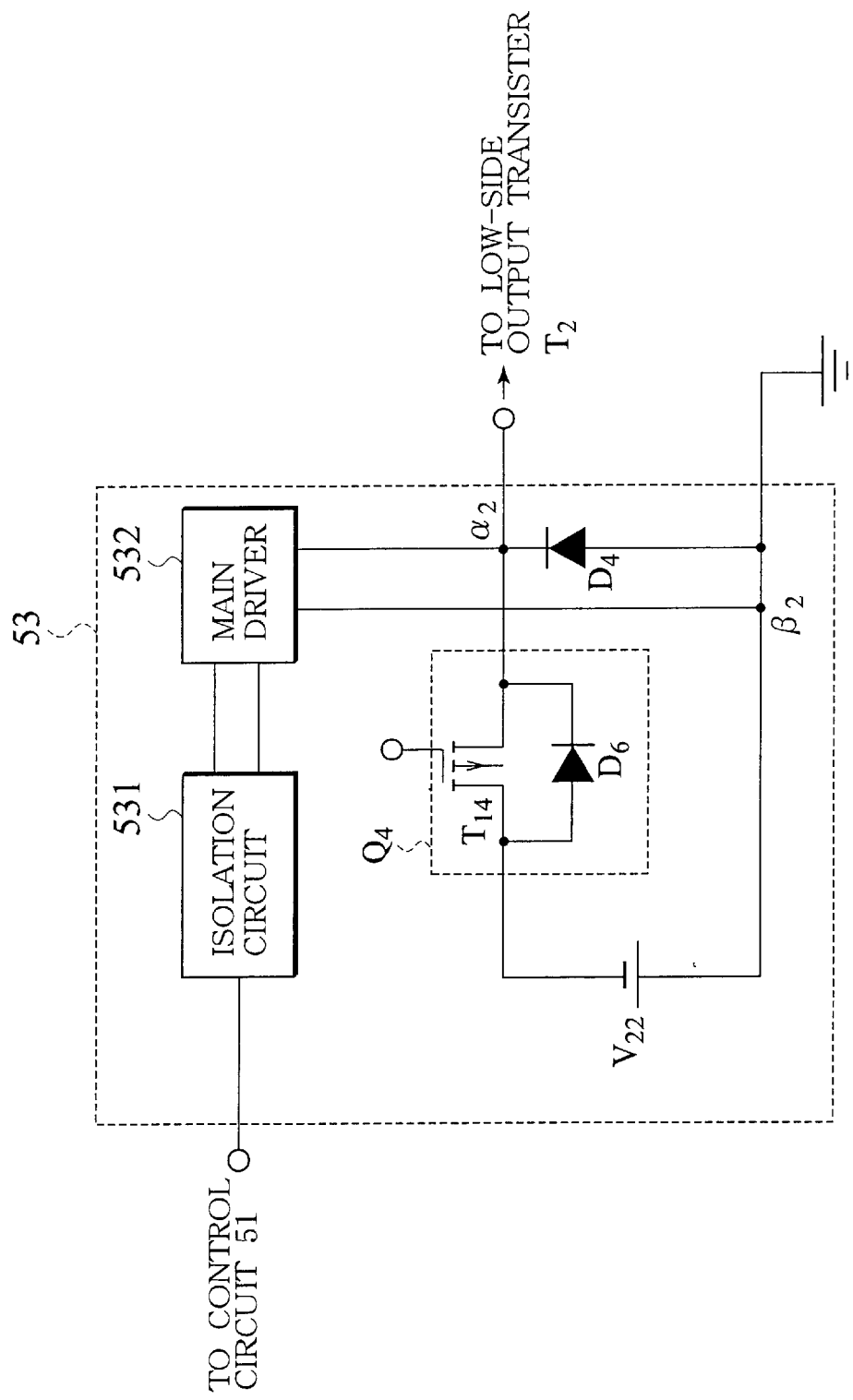
FIG. 14B is a circuit configuration of a lowside-driver in the protective control unit according to the sixth embodiment of the present invention.

Although not explained in details, the lowside-drive circuit 53 has similar circuit configuration to the highside-drive circuit 52. As shown in FIG. 14B, between the base and emitter terminals of the low side-output transistor T2, a bypass diode D4, whose dimension is smaller than the conventional freewheeling diode, is connected. Between the base-emitter terminals of the lowside-output transistor T2, a series circuit having a negative voltage power supply V22 and a pMOS switching element Q4 is connected. Further, the lowside-drive circuit 53 has an isolation circuit 531 and a main driver 532. The main driver 532 is connected between the base-emitter terminals of the lowside-output transistor T2, and the isolation circuit 531 is connected to the main driver 532. In the lowside-drive circuit 53, the control signal supplied from the control circuit 51 is received by the isolation circuit 531, which drives the main driver 532, when the isolation is electrically carried out.

As a concrete example of the circuit configuration, the control circuit 51 may be a micro-controller, and the isolation circuits 521 and 531 are respectively combinations of an isolation circuit and a buffer circuit such as the optical coupler.

Figure 14C:
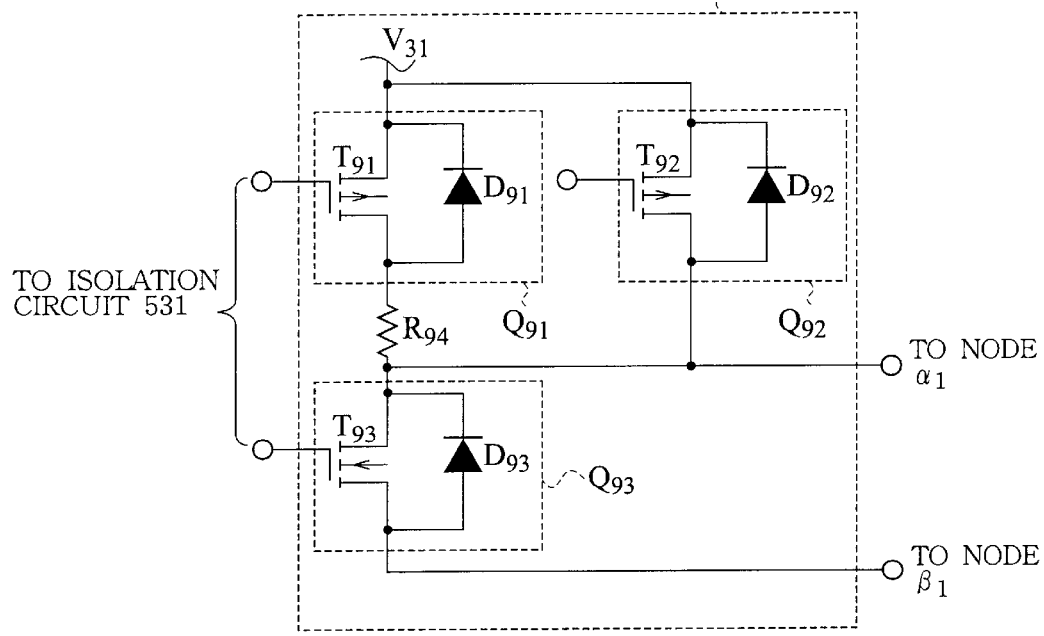
FIG. 14C is a circuit configuration of a main driver of the highside-driver in the protective control unit according to the sixth embodiment of the present invention.

As to the main driver 522 of the highside-drive circuit 52, the circuit configuration is shown in FIG. 14C. A pMOS switching element (first switching element) Q91 and a pMOS switching element (a second switching element) Q92 are connected in parallel between a current source V31 and the base terminal (the first control electrode) of the highside-output transistor T1. The current source V31 supplies the current for the highside-output transistor T1. In addition, a resistor R94 is connected between the pMOS switching element Q91 and the base terminal of the highside-output transistor T1. An nMOS-switching element (a third switching element) Q93 is connected between the base and emitter terminals of the highside-output transistor T1.

Figure 14D:
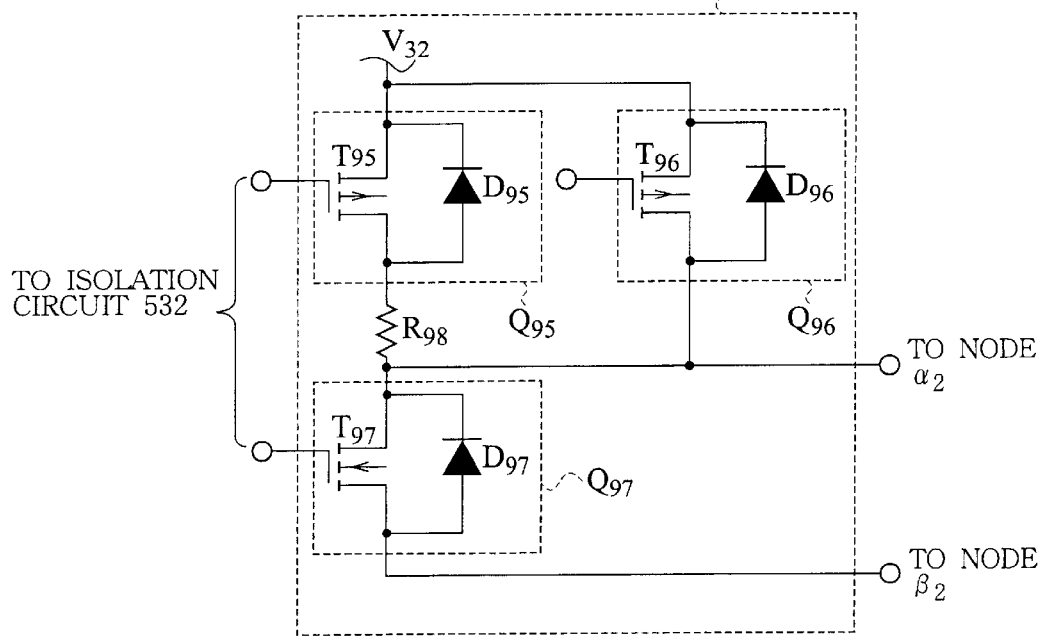
FIG. 14D is a circuit configuration of a main driver of the lowside-driver in the protective control unit according to the sixth embodiment of the present invention.

The circuit configuration of the main driver 532 of the lowside-drive circuit 53 is shown in FIG. 14D. Two pMOS switching elements Q95 and Q96 are connected in parallel between the base terminal of the lowside-output transistor T2 and a current source V32, which supplies the current for the lowside-output transistor T2. In addition, a resistor R98 is connected between the pMOS switching element Q95 and the base terminal of the lowside-output transistor T2. An nMOS-switching element Q97 is connected between the base and emitter terminals of the lowside-output transistor T2.

(Operation of Protective Control Unit)

The operation of the protective control unit according to the sixth embodiment is explained.

(a) First, the pMOS switching element Q3 is supposed to have been turned off. Then, the pMOS switching element Q92 of the main driver 522 of highside-drive circuit 52 turns on so that the highside-output transistor T1 can turn on, while the nMOS switching element Q93 turns off. The current flows in the direction shown by the arrow "Z" in FIG. 14A, when it is done. The pMOS switching element Q92 is turned off in order to turn off the highside-output transistor T1, and the nMOS switching element Q93 is turned on. The current does not flow into the base terminal of the highside-output transistor T1, and the highside-output transistor T1 is turned off.

(b) In this condition, when the lowside-output transistor T2 connected to the emitter terminal of the highside-output transistor T1 turns on, the current flows along the direction shown in "A" in FIG. 14A (c) Afterwards, the counter emf from the inductive load L1 is generated, when the lowside-output transistor T2 is turned off, and the voltage of the node "P" shown in FIG. 14A rises by this counter emf. The bypass diode D3 is forward-biased, when the voltage of this the node "P" rises further than the voltage of the base terminal of the highside-output transistor T1, and the current flows in the direction shown by the arrow "C" in FIG. 14A. Since the pMOS switching element Q3 is turned off, the current flows through the bypass diode D3, along the direction shown by the arrow "C"→"E" in FIG. 14A. As this result, the highside-output transistor T1 turns on in the reverse-direction, and the return current, due to the counter emf, flows along the direction shown by the arrow "B" in FIG. 14A. The function of the emitter terminal and the collector terminal of the highside-output transistor T1 is reversed. Namely, the reverse current flows from the emitter to collector terminal. In the steady state, the current flows from the emitter to collector terminal, and small current ($1/h_{FE}$) flows from the emitter to base terminal.

(d) In the sixth embodiment, under this condition, prior to the timing when the lowside-output transistor T2 turns on again, the pMOS switching element Q3 is turned on. It is possible to detect the timing by monitoring the timing of the control signal of lowside-drive circuit 53, which drives the lowside-output transistor T2. This time, the negative voltage power supply V21 is connected between the base-emitter terminals of the highside-output transistor T1 through the pMOS switching element Q3. Since the voltage power supply V21 provide a negative supply voltage in respect of the reference potential, which is defined as the potential at the base terminal of the highside-output transistor T1, the charges stored in the transistor in the highside-output transistor T1 is quickly pulled out in the direction shown by the arrow "F" in FIG. 14A.

(e) Afterwards, the highside-output transistor T1 turns into the reverse recovery state, when the lowside-output transistor T2 turns on, and the highside-output transistor T1 becomes off state. The through-current penetrating through the highside-output transistor T1 and the lowside-output transistor T2 extremely decreases. Here, reverse recovery time of the highside-output transistor T1 is reduced, and the reverse recovery charges consequentially decreases.

(f) To explain the turn-on-transition of the lowside-output transistor T2 in details, the pMOS switching element Q95 is turned on at first, and next, after any fixed time, the pMOS switching element Q96 is further turned on. In this way, the turn-on-transition of the lowside-output transistor T2 is executed slowly and gradually at first, and the turn-on-transition is executed rapidly at the end so as to completely turn on the lowside-output transistor T2. In view of the reverse recovery current, the resistance value of the base driver spikes only in one period, because the base current (the driving current) that flows into the base terminal of the lowside-output transistor T2 is suppressed so as to grow afterwards to a large value in a short time. In this way, the absolute value of reverse recovery current of the highside-output transistor T1 can be held to a predetermined value, and consequentially, it is possible to reduce further the reverse recovery charges effectively.

(g) During this period, the potential at the node P" slowly starts to decrease. The power dissipation in the switching process increases, when this time spans very long. However, it is possible to choose a minimum amount of the reverse recovery charges, if the period is selected to match with an optimized reverse recovery time, after the control with the negative voltage of the highside-output transistor T1. The fear for the destruction of the lowside-output transistor T2 by the reverse recovery operation of the highside-output transistor T1 is also overcome. Then the perfect operation of the circuit is expected.

The time sequence in regard of the timing of on/off of the highside-output transistor T1 and the lowside-output transistor T2 will be explained here, using FIG. 2, already explained in the first embodiment. As already explained, the square wave of the output signal (Sig13) shown at the top of FIG. 2 corresponds to the on/off state of the highside-output transistor T1. And the square wave of the output signal (Sig33) shown at the middle of FIG. 2, or just under the top square wave corresponds to the on/off state of the lowside-output transistor T2. A slightly after the timing t2 when the highside-output transistor T1 has started the turn-off-transition from the on state, namely, at the timing t3, the lowside-output transistor T2 turns in FIG. 2. Then the charges are pulled out just before the timing t3, by using the negative voltage, through the base terminal of the highside-output transistor T1, and the turn on speed of the lowside-output transistor T2 is controlled. This operation is repeated, as long as the lowside-output transistor T2 turns on under the condition the highside-output transistor T1 is kept in the off state.

In the sixth embodiment, under the condition that the highside-output transistor T1 is in the reverse conducting, and just prior to the timing when it transits into the reverse recovery state, the charges stored in the transistor in the highside-output transistor T1 are actively pulled out by the negative voltage power supply V21, the reverse recovery time is shortened. Further, by controlling the turn-on speed of the lowside-output transistor T2, the absolute value of the reverse recovery current is suppressed. And, as the result, the technical advantage that the protective control unit for the output transistor, which perfectly operates without failure, and operates without generating useless power dissipation ascribable to the through-current can be provided.

(Seventh Embodiment)

Figure 15:
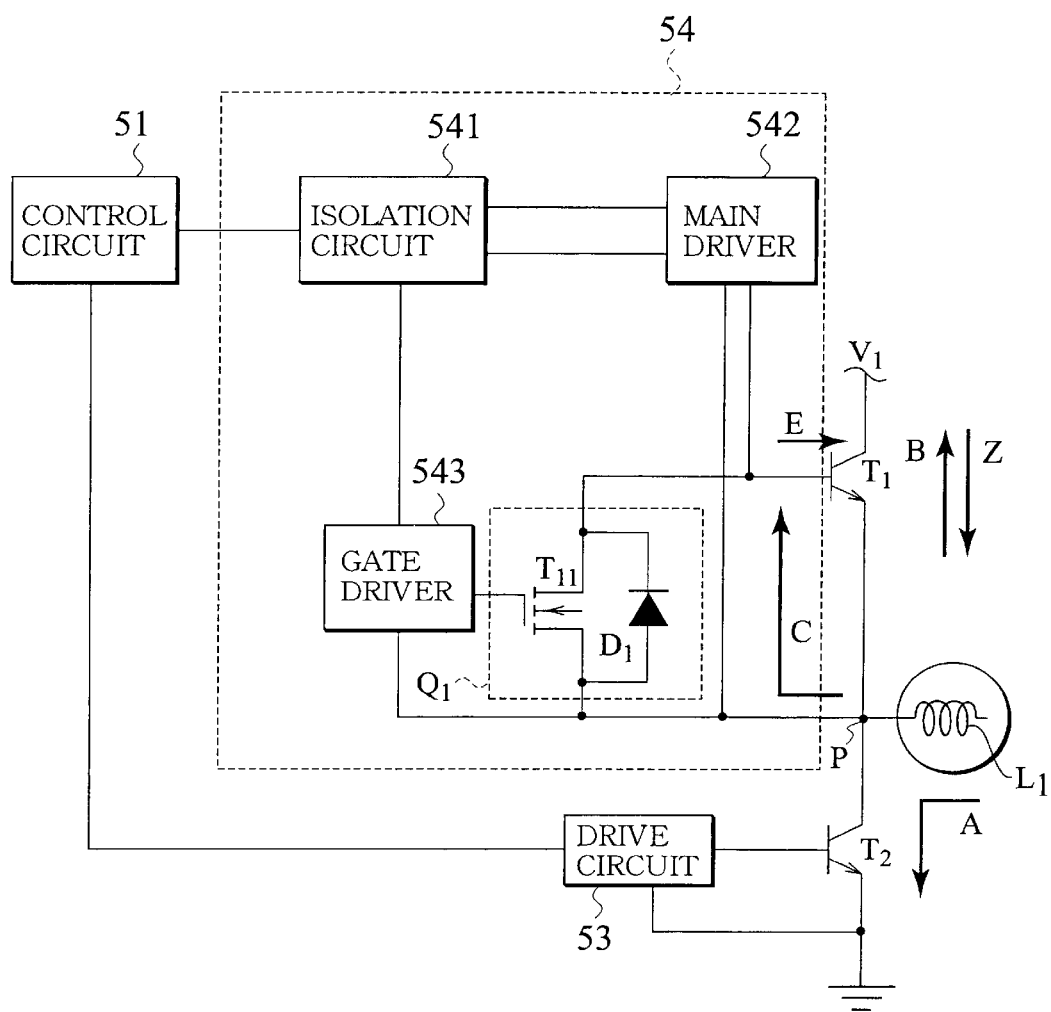
FIG. 15 is a circuit configuration of a protective control unit according to a seventh embodiment of the present invention showing a part of the H bridge circuit.

FIG. 15 shows a part of H bridge circuit as an example of the protective control unit according to the seventh embodiment of the present invention. In FIG. 15, the highside-output transistor T1 and the lowside-output transistor T2 are connected in series. The base terminals of the highside-output transistor T1 and the lowside-output transistor T2 are connected to a highside-drive circuit 54 and a lowside-drive circuit 53, respectively, so that they are driven by a control circuit 51. The highside-drive circuit 54 serves as claimed charge removing means in the present invention, which pulls out charges stored in the highside-output transistor T1, through the first control electrode, during the periods when the highside-output transistor is in the end of reverse conducting state and reverse recovery state. A voltage power supply V1 is connected to the collector terminal of the highside-output transistor T1, and the emitter terminal of the lowside-output transistor T2 is grounded. The inductive load L1 is connected to the node "P", or the connecting point between the emitter terminal of the highside-output transistor T1 and the collector terminal of the lowside-output transistor T2.

The circuit configuration of the seventh embodiment is fundamentally same as the circuit configuration explained in the sixth embodiment, but an nMOS switching element Q1 is connected between the base and emitter terminals of the highside-output transistor T1. The nMOS switching element Q1 has an nMOS transistor T11 and a parasitic body diode D1, structurally merged with the nMOS transistor T11. The nMOS transistor T11 serves as a main device of the nMOS switching element Q1. The parasitic body diode D1 is connected to the nMOS transistor T11 in parallel. Accordingly, the size of the integral body diode D1 is smaller than that of the conventional freewheeling diode here. And, the gate driver 543 for driving the nMOS switching element Q1 is connected to the gate terminal of the nMOS switching element Q1. In the meantime, the conventional freewheeling diode is not being connected between the emitter-collector terminals of the highside-output transistor T1.

(Operation of Protective Control Unit)

Next, the operation of the protective control unit according to the seventh embodiment is explained. It is fundamentally equivalent to the operation of the sixth embodiment, including the respective timings. Then, only the different features and operations from the sixth embodiment are explained.

In the seventh embodiment, the nMOS switching element Q1 is turned on, synchronized with the timing when the negative voltage is provided to the base terminal of the highside-output transistor T1, in the seventh embodiment. Since the return current necessary for turning on the highside-output transistor T1 is provided, not through the integral body diode D1, but through the nMOS transistor T11 serving as the main device, the power dissipation during the turning on transition can be set to a smaller value. Instead of the negative voltage employed in the sixth embodiment, "zero potential" is applied. Since the negative voltage power supply is not necessary, in this case, further miniaturization of the whole protective control unit becomes possible. As to the description of the on speed control of the lowside-output transistor T2, the explanation stated in the sixth embodiment can be maintained.

Similar to the sixth embodiment, the fear of the breakdown failures of the lowside-output transistor T2 due to the reverse recovery operation of the highside-output transistor T1 can be neglected. Furthermore, the useless power dissipation is not generated in the sixth embodiment, and the protective control unit can operate safely.

In the seventh embodiment, it is configured such that the base and emitter terminals are short-circuited mutually by the nMOS switching element Q1, for the period in which the highside-output transistor T1 is under the reverse conducting state and for the period in which the highside-output transistor T1 is under the reverse recovery operation. Furthermore, by applying the restriction on the timing chart such that it can control the turn on speed of the lowside-output transistor T2, the device size can be miniaturized. And, the technical advantage that the semiconductor device having lower power dissipation, suppressing the through-current in the reverse recovery period can be obtained.

(Other Embodiment)

Various modifications will become possible for those skilled in the art after receiving the teachings of the present disclosure without departing from the scope thereof.

In the first to seventh embodiments, it is desired that the reverse current amplification factors $h_{FE}$(rev) of the highside-output transistor T1 and the lowside-output transistor T2 are sufficiently high in order to flow the large return current in the reverse-direction, i.e. in the direction from the emitter to collector terminal of the highside-output transistor T1 and the lowside-output transistor T2.

In general, as the output transistor of the present invention, it is possible to employ the power bipolar transistors, for example. Although npn bipolar transistors are employed as the output transistors of the present invention in the first to seventh embodiments, it is also possible to use pnp bipolar transistors as the output transistors. Of cause, the polarity should be reversed in this case. Since electrons are stored in the transistors of the pnp bipolar transistors, positive voltage power supplies should be used instead of the negative voltage power supplies V21, V22 in FIG. 10, for example. Instead of the power bipolar transistors, normally off type bipolar mode static induction transistors (BSITs) can be used.

However, especially, it is effective, as the output transistor of the present invention, to employ the current controlled semiconductor element disclosed in Japanese Published Unexamined Patent Application 6-252408, since it has a very large reverse current amplification factors $h_{FE}$(rev), which is approximately same as the forward current amplification factors $h_{FE}$(fwd).

What is claimed is:

1. A protective control unit for controlling a current-control-type highside-output transistor having a first main electrode region connected to a power supply, a second main electrode region, a conduction between the first and second main electrode regions being controlled by a current flowing through a first control electrode; a lowside output transistor having a third main electrode region connected to the second main electrode region, a fourth electrode region connected to ground and a second control electrode; and an inductive load connected to a connecting point between the second and the third electrode regions, the protective control unit comprising:

a highside drive circuit configured to pull out charges stored in a semiconductor region between the first and second main electrode regions of the highside-output transistor through the first control electrode during the periods when the highside output transistor is in an end of reverse conducting state and reverse recovery state, and the highside-output transistor is turned on in reverse-direction by a current injected to the semiconductor region through the first control electrode, the current being supplied from the inductive load.

2. A protective control unit for controlling a highside output transistor having a first main electrode region connected to a power supply, a second main electrode region and a first control electrode; a lowside-output transistor having a third main electrode region connected to the second main electrode region, a fourth electrode region connected to ground and a second control electrode; and an inductive load connected to a connecting point between the second and the third electrode regions, the protective control unit comprising:

a highside-drive circuit configured to pull out charges stored in the highside-output transistor through the first control electrode during the periods when the highside-output transistor is in an end of reverse conducting state and reverse recovery state; and a lowside-drive circuit configured to pull out charges stored in the lowside-output transistor through the second control electrode during the periods when the lowside-output transistor is in the end of reverse conducting state and reverse recovery state.

3. A protective control unit for controlling a highside output transistor having a first main electrode region connected to a power supply, a second main electrode region and a first control electrode; a lowside-output transistor having a third main electrode region connected to the second main electrode region, a fourth electrode region connected to ground and a second control electrode; and an inductive load connected to a connecting point between the second and the third electrode regions, the protective control unit comprising:

a highside-drive circuit configured to pull out charges stored in the highside-output transistor through the first control electrode during the periods when the highside-output transistor is in an end of reverse conducting state and reverse recovery state;

wherein said highside-drive circuit is configured to short-circuit between the first control electrode and the second main electrode region during the periods when the highside-output transistor is in the end of reverse conducting state and reverse recovery state.

4. The control unit of claim 2, wherein said lowside-drive circuit is configured to short-circuit between the second control electrode and the fourth main electrode region during the periods when the lowside-output transistor is in the end of reverse conducting state and reverse recovery state.

5. A protective control unit for controlling a highside-output transistor having a first main electrode region connected to a power supply, a second main electrode region and a first control electrode; a lowside-output transistor having a third main electrode region connected to the second main electrode region, a fourth electrode region connected to ground and a second control electrode; and an inductive load connected to a connecting point between the second and the third electrode regions, the protective control unit comprising:

a highside-drive circuit configured to pull out charges stored in the highside-output transistor through the first control electrode during the periods when the highside-output transistor is in an end of reverse conducting state and reverse recovery state;

wherein said highside-drive circuit provides a potential having an opposite polarity so as to pull out the charges stored in the highside-output transistor, during the periods when the highside-output transistor is in the end of reverse conducting state and reverse recovery state.

6. The control unit of claim 2, wherein said lowside-drive circuit provide a potential having an opposite polarity so as to pull out the charges stored in the lowside-output transistor, during the periods when the lowside-output transistor is in the end of reverse conducting state and reverse recovery state.

7. The control unit of claim 3, wherein said highside-drive circuit further comprises:

a highside-switching element configured to connect between the first control electrode and the second main electrode; and a highside-driver providing drive signals to the highside switching element so that the highside switching element conducts during the periods when the highside-output transistor is in the end of reverse conducting state and reverse recovery state.

8. The control unit of claim 4, wherein said lowside-drive circuit further comprises:

a lowside-switching element configured to connect between the second control electrode and the fourth main electrode; and a lowside-driver providing drive signals to the lowside switching element so that the lowside switching element conducts during the periods when the lowside-output transistor is in the end of reverse conducting state and reverse recovery state.

9. The control unit of claim 7, further comprising a highside-control circuit providing control signals to the first control electrode.

10. The control unit of claim 9, wherein said highside-driver provides the drive signals synchronized with the control signals.

11. The control unit of claim 8, further comprising a lowside-control circuit providing control signals to the second control electrode.

12. The control unit of claim 11, wherein said lowside-driver provides the drive signals synchronized with the control signals.

13. A protective control unit for controlling a highside-output transistor having a first, main electrode region connected to a power supply, a second main electrode region and a first control electrode; a lowside-output transistor having a third main electrode region connected to the second main electrode region, a fourth electrode region connected to ground and a second control electrode; and an inductive load connected to a connecting point between the second and the third electrode regions, the protective control unit comprising:

a highside-drive circuit configured to pull out charges stored in the highside-output transistor through the first control electrode during the periods when the highside-output transistor is in an end of reverse conducting state and reverse recovery state;

wherein said highside-drive circuit operates in a floating state, in which a reference potential is defined as a potential at the connecting point between the second and the third electrode regions.

14. The control unit of claim 5, further comprising a highside-bypass diode configured to connect between the first control electrode and the second main electrode.

15. The control unit of claim 6, further comprising a lowside-bypass diode configured to connect between the second control electrode and the fourth main electrode.

16. The control unit of claim 14, wherein said highside drive circuit further comprises:

a constant voltage power supply configured to provide said potential having the opposite polarity so as to pull out the charges;

a highside-switching element configured to control an electrical path between said constant voltage power supply and the first control electrode; and a highside-driver configured to drive said highside-switching element such that said potential is provided to the first control electrode during the periods when the highside-output transistor is in the end of reverse conducting state and reverse recovery state.

17. The control unit of claim 15, wherein said lowside-drive circuit further comprises:

a constant voltage power supply configured to provide said potential having the opposite polarity so as to pull out the charges;

a lowside-switching element configured to control an electrical path between said constant voltage power supply and the second control electrode; and a lowside-driver configured to drive said lowside-switching element such that said potential is provided to the second control electrode during the periods when the lowside-output transistor is in the end of reverse conducting state and reverse recovery state.

18. The control unit of claim 14, wherein said highside-drive circuit further comprises:

a constant voltage power supply;

a complimentary inverter having first and second switching elements, connected between said constant voltage power supply and the connecting point between the second and the third electrode regions;

a capacitor having a first capacitor electrode connected to an output of said complimentary inverter and a second capacitor electrode;

a third switching element connected between said second capacitor electrode and the connecting point between the second and the third electrode regions;

a highside-switching element configured to control an electrical path between said second capacitor electrode and the first control electrode; and a highside-driver providing signals to an input of said complimentary inverter, to said third switching element and to said highside-switching element, configured to provide a potential at said second capacitor electrode to the first control electrode during the periods when the highside-output transistor is in the end of reverse conducting state and reverse recovery state.

19. The control unit of claim 14, wherein said highside-drive circuit further comprises:

a constant voltage power supply;

a first switching element connected to said constant voltage power supply;

a coil having a first coil terminal, connected to said first switching element, and a second coil terminal;

a second switching element connected between said first coil terminal and the connecting point between the second and the third electrode regions;

a highside-switching element configured to control an electrical path between said first coil terminal and the first control electrode; and a driver providing signals to an input of said first and second switching element and to said highside-switching element, configured to provide a potential at first coil terminal to the first control electrode during the periods when the highside-output transistor is in the end of reverse conducting state and reverse recovery state.

20. The control unit of claim 16, wherein said highside-drive circuit further comprises a main driver configured to change amounts of drive currents to be injected in the first control electrode, according to a time schedule, so as to change a turn-on speed of the highside-output transistor dynamically.

21. The control unit of claim 20, wherein said main driver further comprises:

a current source;

a first switching element connected to said current source;

a resistor configured to be connected between switching element and the first control electrode;

a second switching element configured to connected between said current source and the first control electrode; and a third switching element configured to be connected between said the first control electrode and the second main electrode.

22. The control unit of claim 3, wherein said highside-drive circuit further comprises a main driver configured to change amounts of drive currents to be injected in the first control electrode, according to a time schedule, so as to change a turn-on speed of the highside-output transistor dynamically.

23. The control unit of claim 22, wherein said main driver further comprises:

a current source;

a first switching element connected to said current source;

a resistor configured to be connected between said first switching element and the first control electrode;

a second switching element configured to be connected between said current source and the first control electrode; and a third switching element configured to be connected between said the first control electrode and the second main electrode.

24. A protective control unit for controlling a current-control-type highside output transistor having a first main electrode region connected to a power supply, a second main electrode region, a conduction between the first and second main electrode regions is controlled by a current flowing through a first control electrode; a lowside-output transistor having a third main electrode region connected to the second main electrode region, a fourth electrode region connected to ground and a second control electrode; and an inductive load connected to a connecting point between the second and the third electrode regions, the highside-output transistor being turned on in reverse direction by a current injected to a semiconductor region between the first and second main electrode regions through the first control electrode, the current being supplied from the inductive load, the protective control unit comprising:

a charge removing means for pulling out charges stored in the semiconductor region of the highside-output transistor through the first control electrode during the periods when the highside-output transistor is in an end of reverse conducting state and reverse recovery state.

25. A protective control unit for controlling a highside output transistor having a first main electrode region connected to a power supply, a second main electrode region and a first control electrode; a lowside-output transistor having a third main electrode region connected to the second main electrode region, a fourth electrode region connected to ground and a second control electrode; and an inductive load connected to a connecting point between the second and the third electrode regions, the protective control unit comprising:

a charge removing means for pulling out charges stored in the highside-output transistor through the first control electrode during the periods when the highside-output transistor is in an end of reverse conducting state and reverse recovery state; and a turn-on speed controlling means for changing drive current to be injected in the first control electrode, according to a time schedule.

* * * * *